(12) United States Patent
Gruber et al.

(10) Patent No.: US 10,965,308 B1
(45) Date of Patent: Mar. 30, 2021

(54) DIGITAL-TO-ANALOG CONVERTER, DATA PROCESSING SYSTEM, BASE STATION, MOBILE DEVICE AND METHOD FOR GENERATING AN ANALOG SIGNAL

(71) Applicant: Intel Corporation, Santa Clara, CA (US)

(72) Inventors: Daniel Gruber, St. Andrä (AT); Martin Clara, Santa Clara, CA (US); Michael Kalcher, Villach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/912,792

(22) Filed: Jun. 26, 2020

(51) Int. Cl.
*H03M 1/66* (2006.01)
*H04B 1/04* (2006.01)

(52) U.S. Cl.
CPC ............ *H03M 1/66* (2013.01); *H04B 1/0475* (2013.01)

(58) Field of Classification Search
CPC ...... H03M 1/687; H03M 1/66; H03M 1/1009; H03M 1/68; H03M 1/70; H04B 1/0475
See application file for complete search history.

(56) References Cited

U.S. PATENT DOCUMENTS

| 7,068,978 | B2 * | 6/2006 | Sekiguchi | H03M 1/685 |
| | | | | 341/126 |
| 9,577,657 | B1 * | 2/2017 | Clara | H03M 1/109 |
| 9,900,016 | B1 | 2/2018 | Trampitsch et al. | |
| 10,090,854 | B1 * | 10/2018 | Clara | H03M 1/687 |
| 10,608,661 | B1 * | 3/2020 | Gruber | H01P 5/10 |

FOREIGN PATENT DOCUMENTS

WO PCT/US2019/068225   12/2019

* cited by examiner

*Primary Examiner* — Sonny Trinh
(74) *Attorney, Agent, or Firm* — 2SPL Patent Attorneys PartG mbB; Kieran O'Leary

(57) ABSTRACT

A digital-to-analog converter comprises a plurality of first digital-to-analog converter cells configured to generate a first analog signal based on first digital data, wherein the first digital-to-analog converter cells of the plurality of first digital-to-analog converter cells are coupled to a first output node for coupling to a first load. Further, the digital-to-analog converter comprises a plurality of second digital-to-analog converter cells configured to generate one or more second analog signals based on second digital data, wherein the second digital-to-analog converter cells of the plurality of second digital-to-analog converter cells are coupled to one or more second output nodes, and wherein the plurality of first digital-to-analog converter cells and the plurality of second digital-to-analog converter cells are coupled to a power supply node for coupling to a mutual power supply.

24 Claims, 17 Drawing Sheets

US 10,965,308 B1

DIGITAL-TO-ANALOG CONVERTER, DATA PROCESSING SYSTEM, BASE STATION, MOBILE DEVICE AND METHOD FOR GENERATING AN ANALOG SIGNAL

FIELD

The present disclosure relates to digital-to-analog conversion. In particular, examples relate to a Digital-to-Analog Converter (DAC), a data processing system, a base station, a mobile device and a method for generating an analog signal based on digital data.

BACKGROUND

Linearity performance of a Capacitive DAC (CDAC) depends primarily on the impedance of the reference power supply. A finite impedance of the reference power supply subject to normal data switching in a CDAC leads to an (attenuated and phase-shifted) rectified version of the CDAC output signal that develops on the reference power supply. This signal content on the reference supply is subsequently multiplied with the CDAC output signal and leads to harmonic distortions in the CDAC output signal (e.g. third and higher order harmonics).

Hence, there may be a desire for an improved DAC architecture.

BRIEF DESCRIPTION OF THE FIGURES

Some examples of apparatuses and/or methods will be described in the following by way of example only, and with reference to the accompanying figures, in which

FIG. 9b is a diagram of the normalized supply current drawn by the first DAC cells, the normalized supply current drawn by the enabled second DAC cells and the total supply current over time corresponding to FIG. 9a;

FIG. 10a is the thermometer data for several samples of a first digital signal;

FIG. 10b is the thermometer dummy data for several samples of the first digital signal of FIG. 10a;

FIG. 11b is the thermometer dummy data for several samples of the first digital signal of FIG. 11a;

FIG. 12a is the thermometer data for several samples of a first digital signal;

FIG. 12b is the thermometer dummy data for several samples of the first digital signal of FIG. 12a;

DETAILED DESCRIPTION

Figure 1:
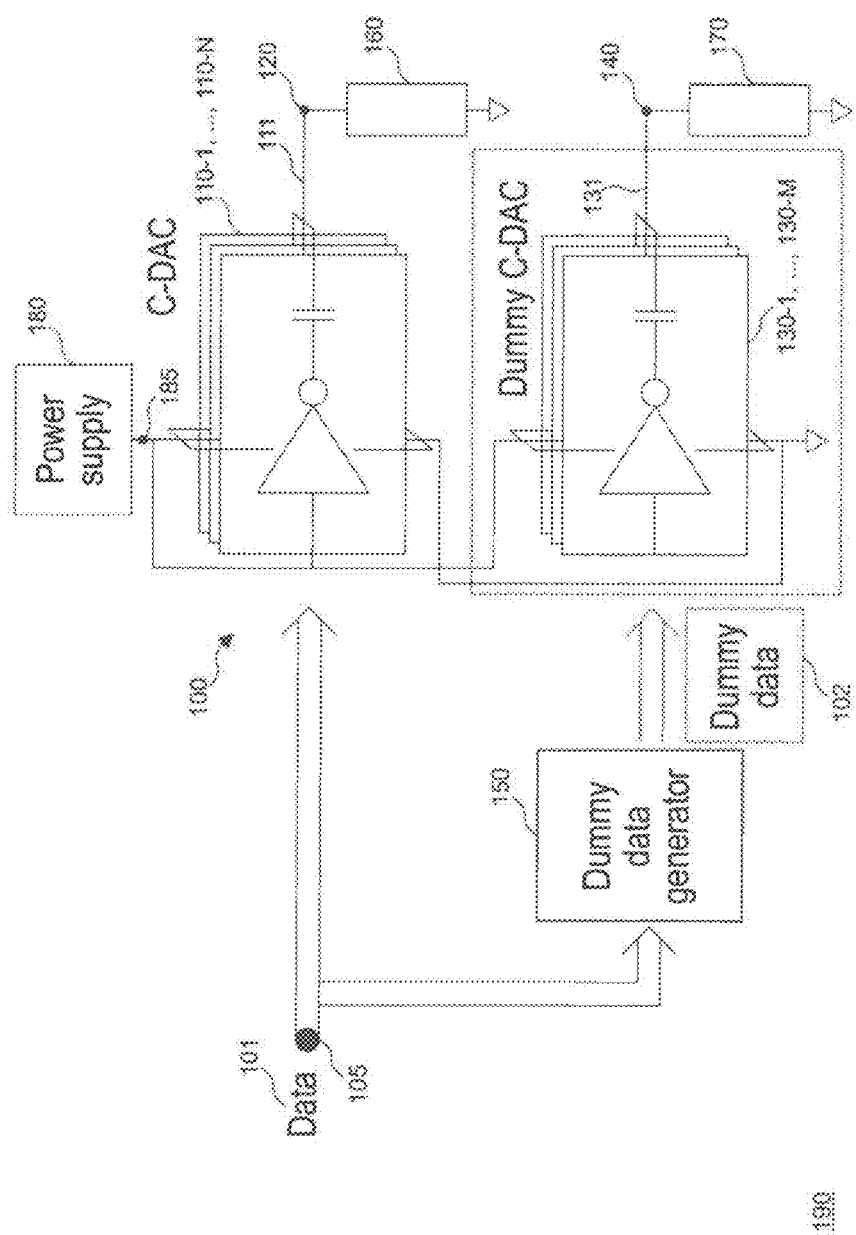
FIG. 1 illustrates an example of a data processing system comprising a DAC.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Linearity in a D/A-converter (digital-to-analog converter) is often limited by the finite impedance of the power supply. Any signal correlated supply current drawn by the DAC may modulate the supply voltage and disturb the DAC output waveform due to artifacts such as direct AMAM (amplitude output versus amplitude input) distortion or AMPM (output phase shift in degrees versus input amplitude) or skew modulation.

This may be especially true for capacitive DACs where linearity depends primarily on the impedance of the reference power supply. A finite impedance of the reference power supply subject to normal data switching in a capacitive D/A-converter may lead to an (attenuated and phase-shifted) rectified version of the output signal that develops on the reference power supply. This signal content on the reference supply may be subsequently multiplied with the output signal and leads to third-order (and higher order) harmonic distortion. The following examples may describe concepts to minimize/reduce or avoid such distortion.

FIG. 1 illustrates an example of data processing system 190 comprising a DAC 100 according to the proposed architecture. For example, the data processing system 190 may be a (e.g. wireless or wired) transmitter or any other system that uses digital-to-analog conversion.

The DAC 100 comprises a plurality of first DAC cells 110-1, ..., 110-N configured to generate a first analog signal 111 based on a first digital data (digital input data) 101. The plurality of first DAC cells 110-1, ..., 110-N may be any number (N≥2) of DAC cells (e.g. N is based a desired resolution of the DAC). The plurality of first DAC cells 110-1, ..., 110-N are coupled to a first output node 120 of the DAC 100 for coupling to a first load 160. The first load 160 may be any device couplable to the DAC 100 for further processing the first analog signal 111 of the DAC 100. For example, the first load may be a filter, an up-converter (mixer), a Power Amplifier (PA) or an antenna.

The DAC 100 additionally comprises a plurality of second DAC cells 130-1, ..., 130-M configured to generate a second analog signal 131 based on second digital data (digital dummy data) 102. The plurality of second DAC cells 130-1, ..., 130-M may be any number M≥2 of DAC cells. In particular, the number M of the DAC cells 130-1, ..., 130-M may be equal to the number N of the DAC cells 110-1, ..., 110-N. The plurality of second DAC cells 130-1, ..., 130-M are coupled to one or more second output nodes 140 of the DAC 100 for coupling to one or more second loads (dummy load) 170. Alternatively, the one or more second output nodes 140 are floating and/or unterminated.

Although the proposed DAC architecture is described below with respect to the plurality of first DAC cells 110-1, ..., 110-N and the plurality of second DAC cells 130-1, ..., 130-M, it is to be noted that the proposed DAC architecture may as well be used for a DAC comprising only one first DAC cell and only one second DAC cell.

The first digital data 101 is received by an input node 105 of the DAC 100 and is an information that contains useful data (e.g. data to be transmitted such as user data). As indicated in FIG. 1, the plurality of first DAC cells 110-1, ..., 110-N are driven based on the first digital data 101. For example, the DAC 100 may comprises one or more circuits configured to generate and supply one or more respective drive signals to the plurality of first DAC cells 110-1, ..., 110-N for activating and/or driving one or more of the plurality of first DAC cells 110-1, ..., 110-N in order to generate a respective cell output signal contributing to the first analog signal 111 (e.g. one or more cell output signals generated by one or more of the plurality of first DAC cells 110-1, ..., 110-N may be combined to the first analog signal 111).

The second digital data 102 is different from the first digital data 101. The second digital data 102 is an information that does not contain any useful data (i.e. dummy data) in contrast to the first digital data 101. Accordingly, the second load 170 is a load that terminates the second analog signal 131 (e.g. the second load 170 couples the second output node 140 to ground). In other words, the second analog signal 131 is not further processed. For example, the second load 170 may be a resistive element (resistor) coupling the second output node 140 to ground.

A (dummy) data generation circuit 150 of the DAC 100 is configured to receive the first digital data 101 and to generate the second digital data 102 based on the first digital data 101. As indicated in FIG. 1, the plurality of second DAC cells 130-1, ..., 130-M are driven based on the second digital data 102. For example, the DAC 100 may comprise one or more circuits configured to generate and supply one or more respective drive signals to the plurality of second DAC cells 130-1, ..., 130-M for activating and/or driving one or more of the plurality of second DAC cells 130-1, ..., 130-M in order to generate a respective cell output signal contributing to the second analog signal 131 (e.g. one or more cell output signals generated by one or more of the plurality of second DAC cells 130-1, ..., 130-M may be combined to the second analog signal 131).

As indicated in FIG. 1, the plurality of first DAC converter cells 110-1, ..., 110-N and the plurality of second DAC cells 130-1, ..., 130-M are couplable to a power supply 180 for drawing a supply current from the power supply 180. For example, the DAC 100 may comprise a power input node 185 for coupling the DAC units 110-1 to 110-n and dummy DAC units 13-1 to 130-M to the power supply 180. The plurality of first DAC converter cells 110-1, . . . , 110-N and the plurality of second DAC cells 130-1, . . . , 130-M are coupled to the power input node 185 such that they are couplable to the power supply 180 via the power input node 185.

Driving the plurality of second DAC cells 130-1, . . . , 130-M based on the dummy data 102 may allow to decorrelate the supply current from the first digital data 101. For example, driving the plurality of second DAC cells 130-1, . . . , 130-M based on the dummy data 102 may enable a first digital data 101 to be independent of the supply current. This may enable to improve the linearity of the DAC 100 beyond what is currently feasible by making the impedance of the power supply 180 as low as possible.

Figure 2:
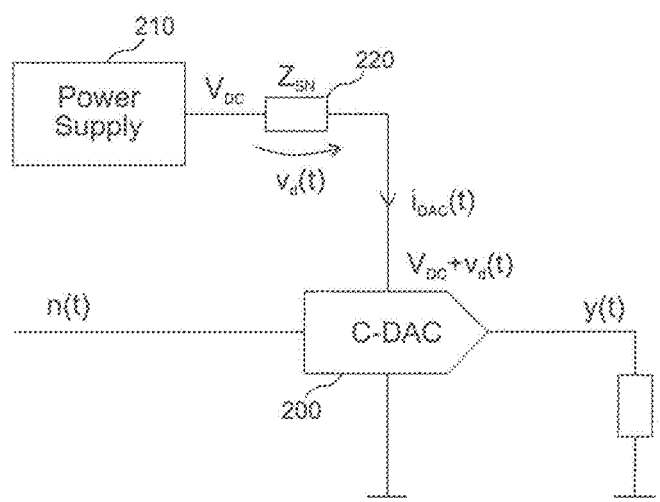
FIG. 2 illustrates a power supply schematic.

The above described technical effect of the dummy data driven plurality of second DAC cells 130-1, . . . , 130-M will become more evident when comparing the DAC 100 described above with the DAC 200 illustrated in FIG. 2. Compared to the DAC 100, the DAC 200 does not comprise dummy data driven DAC cells. The DAC 200 solely comprises DAC cells driven based on the first digital data n(t).

The main source of non-linearity in the DAC 200 (e.g. a CDAC) is the finite impedance of the DAC 200's power supply 210. As the power supply 210 acts as the DAC reference, every disturbance on the supply will impact the DAC output and will thus be directly visible on the DAC output y(t) as a mixing product of the power supply with the DAC input code n(t).

The supply $V_{DD}(t)$ of the DAC 200 can be described as follows:

$$V_{DD}(t) = V_{DC} + i_{DAC}(t) * T(t)$$
$$= V_{DC} + g(n(t)) * T(t)$$
$$= V_{DC} + v_d(t)$$

T (t) denotes the impulse response of the supply network 220 that represents the complex impedance of the supply network, $i_{DAC}(t)$ denotes the supply current drawn by the DAC 200, and $V_{DC}$ denotes the DC value of the supply. The function g(x) denotes the non-linear function that maps the DAC input code n(t) to supply current $i_{DAC}(t)$. The function g(x) may be as simple as a rectification g(n(t))=|n(t)| or may be approximated with a polynomial characteristic. $v_d(t)$ denotes the transient and signal dependent part of the supply voltage that is causing the distortion in the DAC output y(t).

The resulting output waveform y(t) of the DAC 200 is proportional to the multiplication of $V_{DD}(t)$ with the DAC input signal n(t) as is shown in the following:

$$y(t) \sim n(t) \times V_{DD}(t)$$

$$y(t) \sim n(t) \times V_{DC} + n(t) \times v_d(t)$$

The term $y_d(t)=n(t) \times v_d(t)$ describes describing the resulting non-linearity in the DAC output y(t).

Referring back to the DAC 100 illustrated in FIG. 1, the current $i_{DAC}(t)$ drawn by the DAC 100 from the power supply 180 may be decorrelated from the first digital data 101 by means of the dummy path provided by the generator 150 and DAC units 130-1 to 130-M. Accordingly, the impedance of the current supply network (i.e. the impedance of the power supply 180 and other intermediate elements such as current supply lines etc.) does no longer result in a transient signal dependent supply voltage. Therefore, the term $v_d(t)$ will be zero or at least close to zero. As a consequence, distortion components such as third and higher order harmonics may be reduced or even cancelled in the first analog signal 111. As a trade-off, the noise level of the first analog signal 111 may increase. However, this is tolerable in many applications.

In FIG. 1, the implementation of the plurality of first DAC cells 110-1, . . . , 110-N and the plurality of second DAC cells 130-1, . . . , 130-M is exemplarily illustrated, respectively, by the DAC cell 110-1 and the DAC cell 130-1. The DAC cell 110-1 and the DAC cell 130-1 are illustrated as capacitive DAC cells comprising a respective capacitive element that generates the respective cell output signal based on the output signal of the respective inverter circuit 113-1, 133-1 which is driven based on the first digital data 101 or the second digital data 102, respectively. However, it is to be noted that the plurality of first DAC cells 110-1, . . . , 110-N and the plurality of second DAC cells 130-1, . . . , 130-M may alternatively be resistive DAC cells. In other words, the plurality of first DAC cells 110-1, . . . , 110-N and the plurality of second DAC cells 130-1, . . . , 130-M may comprise a resistive element instead of a capacitive element for generating the respective cell output signal.

The plurality of second DAC cells 130-1, . . . , 130-M may be implemented identical to or different from the plurality of first DAC cells 110-1, . . . , 110-N. According to some examples, the plurality of second DAC cells 130-1, . . . , 130-M are capable of driving a signal current that differs less than 50%, 25%, 10%, 5% from a signal current that can be driven by the plurality of first DAC cells 110-1, . . . , 110-N. The more similar the signals currents that can be driven by the plurality of first DAC cells 110-1, . . . , 110-N and the plurality of second DAC cells 130-1, . . . , 130-M are, the more the supply current drawn by the DAC 100 may be decorrelated from the first digital data 101.

Taking into account the switching of the plurality of second DAC cells 130-1, . . . , 130-M due to the second digital data 102, the supply voltage $V_{DD}(t)$ of the DAC 100 may be described as follows:

$$V_{DD}(t) = V_{DC} + i_{DAC}(t) * T(t)$$
$$= V_{DC} + g(n(t) + d(t)) * T(t)$$
$$= V_{DC} + v_d(t)$$

n(t) denotes the first digital data 101 and d(t) represents the second digital data 102.

The data generation circuit 150 may generate the second digital data 102 in many different ways in order to decorrelate the supply current from the first digital data 101. According to some examples, the data generation circuit 150 may generate the second digital data 102 such that one of the following mathematical expressions is fulfilled:

$$|g(n(t)+d(t))*T(t)| < |g(n(t))|$$

or $$|\text{corr}(g(n(t)+d(t))*T(t),n(t))| < |\text{corr}(g(n(t))*T(t),n(t))|$$

In the following some non-limiting examples for how to generate the second digital data 102 will be given.

For example, the data generation circuit 150 may be configured to generate the second digital data 102 such that the second analog signal 131 is opposite to the first analog signal 111. In other words, the second digital data 102 may be the exact opposite of the first digital data 101 such that the switching behavior of the plurality of second DAC cells 130-1, ..., 130-M is opposite to the switching behavior of the plurality of first DAC cells 110-1, ..., 110-N. Accordingly, the supply current drawn by the DAC 100 may be kept constant such that also supply voltage does not depend on the first digital data 101. Accordingly, third and higher order distortions in the first analog signal 111 may be suppressed.

In other examples, the data generation circuit 150 may be configured to generate the second digital data 102 such that a temporal progression of a sum of an absolute signal value of the first analog signal 111 and an absolute signal value of the second analog signal 131 is constant. In other words, the second digital data 102 may be generated such that a temporal progression of a sum of an absolute signal value represented by the second digital data 102 and an absolute signal value represented by the first digital data 101 is constant.

In further examples, the data generation circuit 150 may be configured to generate the second digital data 102 such that a signal value of the second analog signal 131 corresponds to a constant value minus an absolute signal value of the first analog signal 111. In other words, the second digital data 102 may be generated such that a signal value represented by the second digital data 102 corresponds to a constant value minus an absolute signal value represented by the first digital data 101. This is illustrated in FIG. 3.

Figure 3:
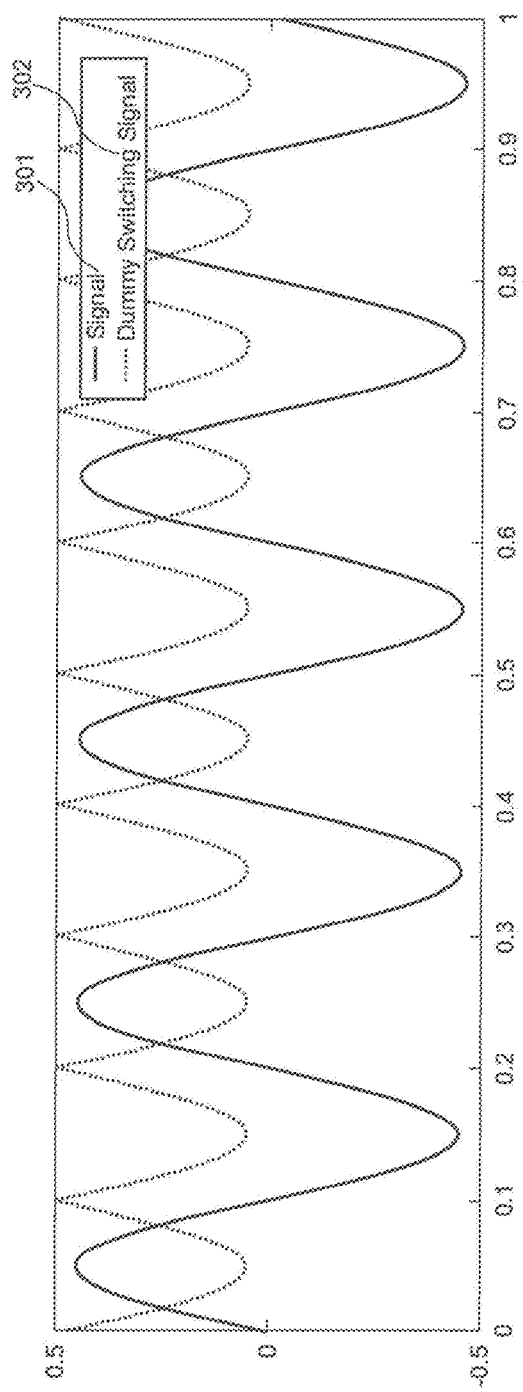
FIG. 3 illustrates exemplary DAC input signals.

FIG. 3 illustrates the temporal progressions of the signal value 301 represented by the first digital data 101 and the signal value 302 represented by the second digital data 102. The temporal progressions of the signal value 302 represented by the second digital data 102 is 0.5 minus the absolute value of signal value 301 represented by the first digital data 101.

Figure 4:
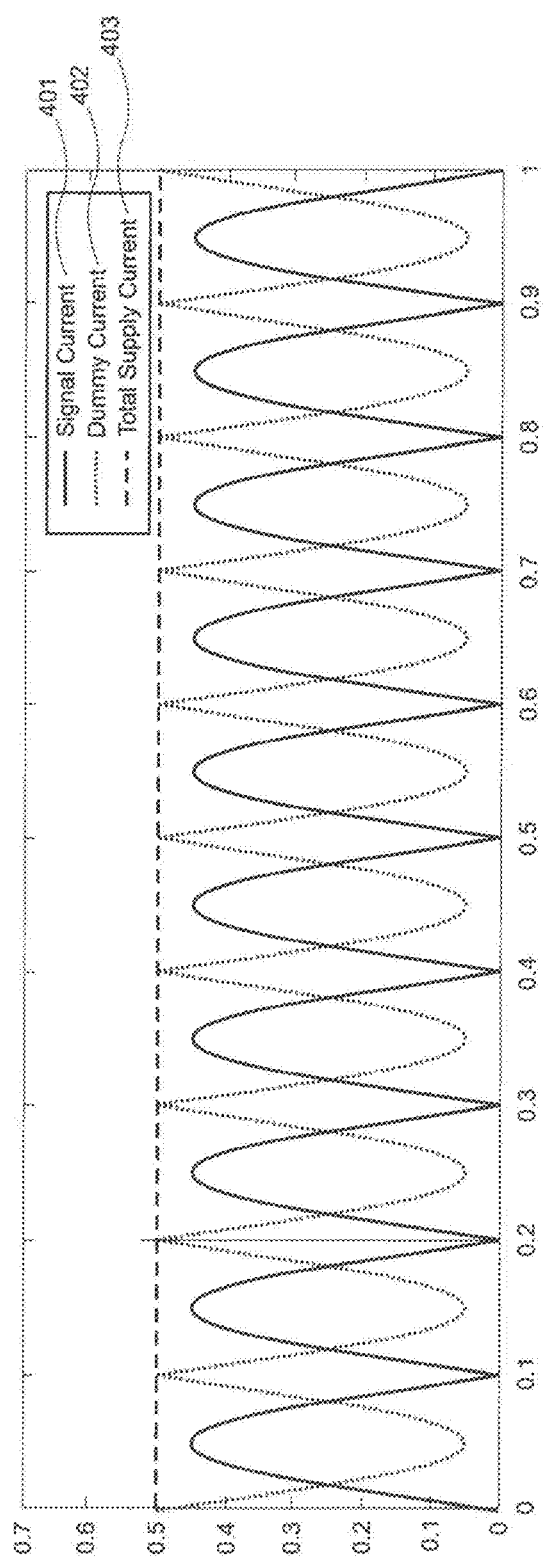
FIG. 4 illustrates exemplary DAC supply currents.

An overview over the resulting supply currents is illustrated in FIG. 4. In particular, the temporal progressions of the supply current 401 drawn by the plurality of first DAC cells 110-1, ..., 110-N, the supply current 402 drawn by the plurality of second DAC cells 130-1, ..., 130-M, and the total supply current 403 drawn by the DAC 100 are illustrated in FIG. 4. As can be seen, the supply currents 401 and 402 add up to a constant total supply current 403 due to the above described structure of the second digital data 102. Therefore, distortions such as third and higher order distortions may be suppressed in the first analog signal 111.

It is to be noted that the total drawn supply current does not necessarily have to be constant. In order to avoid distortion of the first analog signal 111, the drawn supply current is to be input signal/data independent. Creating the dummy data in such a way that the total supply current drawn by the plurality of first DAC cells 110-1, ..., 110-N and the plurality of second DAC cells 130-1, ..., 130-M is input signal/data independent and more noise like does not lead to distortions but only added noise to the first analog signal 111 (i.e. the DAC output) which, depending on the noise level, is tolerable for many applications.

The first load 160 coupled to the first output node 120 and the second load 170 coupled to the second output node 140 may present similar load impedance to the DAC 100 in order to improve the decorrelation between the drawn supply current (drawn from the power supply 180) from the first digital data 101. For example, the load impedances presented to the DAC 100 by the first load 160 and the second load 170 may differ at maximum by a factor of 4, 3, 2 or less. The more similar the load impedances presented to the DAC 100 by the first load 160 and the second load 170 are, the more the supply current drawn by the DAC 100 may be decorrelated from the first digital data 101.

The first load 160 and the second load 170 may, e.g., be integrated in the same semiconductor die as the DAC 100. In alternative examples, at least one of the first load 160 and the second load 170 may be arranged off (outside) the semiconductor die comprising the DAC 100. In other words, at least one of the first load 160 and the second load 170 is not arranged in the semiconductor die in some examples. For example, at least one of the first load 160 and the second load 170 may be integrated in a different semiconductor die than the DAC 100. In other examples, at least one of the first load 160 and the second load 170 may be arranged on or be integrated in a device that is not a semiconductor device. For example, the first load 160 or the second load 170 may be a passive filter arranged on a Printed Circuit Boards (PCB).

In comparison to the examples described in connection with FIGS. 1-4, the number of switching dummy cells may be reduced to reduce the overall current consumption. With the extension of partial dummy switching, the number of dummy cells and drivers performing dummy switching operation may be only a subset of normal DAC cells.

Figure 5A:
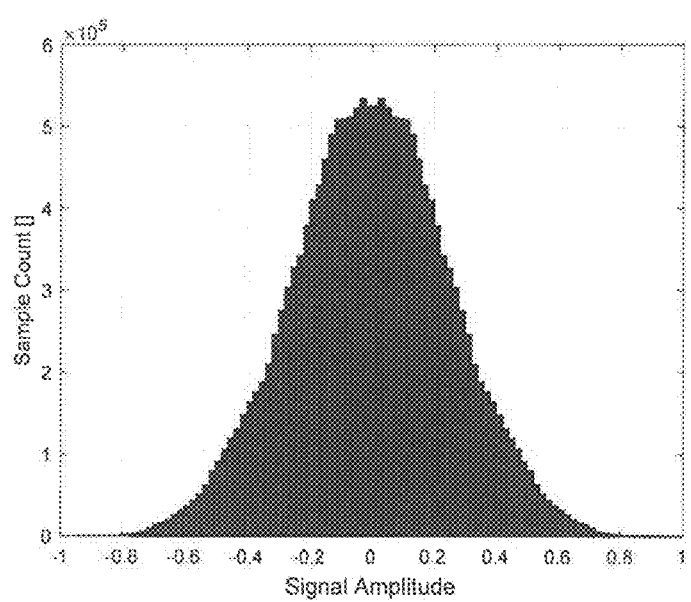
FIG. 5a is a diagram illustrating a signal amplitude distribution of an OFDM signal.
Figure 5B:
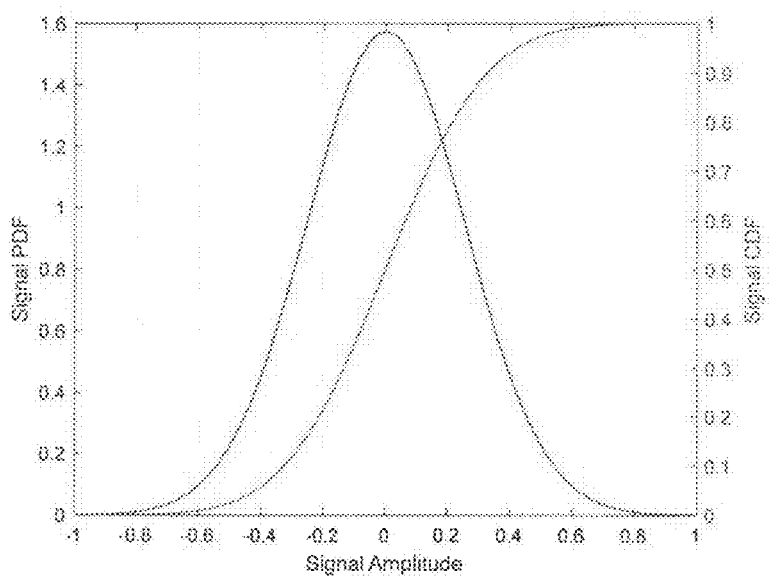
FIG. 5b is a diagram illustrating the amplitude PDF and CDF of an OFDM signal.

Some communication signals may use modulation schemes like OFDM (Orthogonal Frequency-Division Multiplexing) for transmit signals. These signals may have properties that can be exploited when defining the number of DAC cells that perform dummy switching. For example, a crest factor of such an RF signal would be 12 dB and the amplitude probability density function may resemble a gaussian distribution. This may mean that for 68% of the time, the input signal may have an amplitude smaller than ¼ of the DAC full scale. For example, FIG. 5a shows a signal amplitude distribution of an OFDM signal and FIG. 5b shows the amplitude PDF (probability density function) and CDF (Cumulative Distribution Function) of an OFDM signal.

Figure 6:
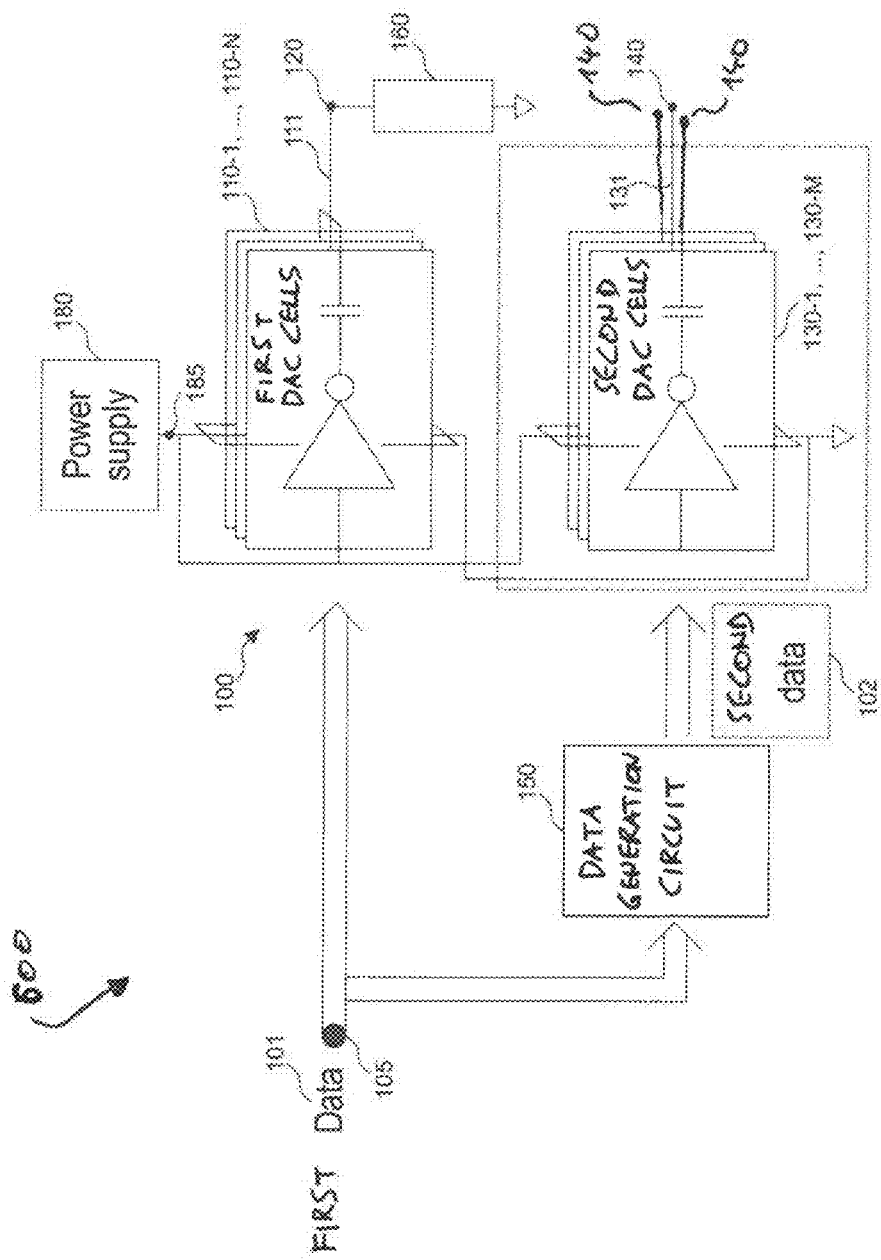
FIG. 6 is a schematic illustration of a DAC.

FIG. 6 shows a schematic illustration of a digital-to-analog converter according to an example. The digital-to-analog converter 600 comprises a plurality of first digital-to-analog converter cells 110-1, ..., 110-N configured to generate a first analog signal 111 based on first digital data 101. The first digital-to-analog converter cells 110-1, ..., 110-N of the plurality of first digital-to-analog converter cells are coupled to a first output node 120 for coupling to a first load 160. Further, the digital-to-analog converter 600 comprises a plurality of second digital-to-analog converter cells 130-1, ..., 130-M configured to generate one or more second analog signals 131 based on second digital data 102. The second digital-to-analog converter cells 130-1, ..., 130-M of the plurality of second digital-to-analog converter cells are coupled to one or more second output nodes 140. The plurality of first digital-to-analog converter cells 110-1, ..., 110-N and the plurality of second digital-to-analog converter cells 130-1, ..., 130-M are coupled to a power supply node 185 for coupling to a mutual power supply 180. Additionally, the digital-to-analog converter 600 comprises a data generation circuit 150 configured to generate the second digital data 102 based on at least one of the first digital data 101 and a random parameter. The plurality of first digital-to-analog converter cells 110-1, ..., 110-N may comprise more digital-to-analog converter cells than the plurality of second digital-to-analog converter cells 130-1, ..., 130-M. Additionally or alternatively, the second digital-to-analog converter cells 130-1, ..., 130-M of the plurality of second digital-to-analog converter cells may be configured to be individually enabled based on individual enabling signals.

Due to the lower number of second digital-to-analog converter cells and/or the possibility for enabling and disabling a part of the second digital-to-analog converter cells, the current consumption of the digital-to-analog converter may be reduced in comparison to a digital-to-analog converter switching as many dummy cells as normal cells. For example, coupling the plurality of first digital-to-analog converter cells and the plurality of second digital-to-analog converter cells to the mutual power supply 180 may cause minimization of artifacts by decorrelating the first digital signal from the supply current provided by the mutual power supply to the power supply node 185.

For example, the first digital-to-analog converter cells 110-1, . . . , 110-N do contribute to the first analog signal 111 (e.g. analog output signal of the DAC), while the second digital-to-analog converter cells 130-1, . . . , 130-M do not contribute to the first analog signal 111. The first output node 120 may be electrically insulated from the one or more second output nodes 140.

The digital-to-analog converter 600 may comprise less second digital-to-analog converter cells 130-1, . . . , 130-M (e.g. less dummy cells) than first digital-to-analog converter cells 110-1, . . . , 110-N (e.g. normal cells). In this way, the space consumption of the DAC may be reduced and the current consumption for dummy switching may be reduced. For example, the plurality of first digital-to-analog converter cells 110-1, . . . , 110-N may comprise at least twice (or at least 1.5 times, at least 2.5 times or at least 3 times) as many digital-to-analog converter cells than the plurality of second digital-to-analog converter cells 130-1, . . . , 130-M.

Additionally or alternatively, the second digital-to-analog converter cells 130-1, . . . , 130-M may be configured to be enabled or disabled by individual enabling signals. In this way, the number of second digital-to-analog converter cells 130-1, . . . , 130-M enabled for dummy switching may be adjustable over time. Some input signal may require more enabled dummy cells than other input signal to obtain a desired degree of decorrelation between digital input signal and analog output signal. According to the described concept, the degree of signal distortion compensation may be adjustable to the respective demand so that the total consumption may be reduced. For example, the second digital-to-analog converter cells 130-1, . . . , 130-M of the plurality of second digital-to-analog converter cells may be configured to be individually enabled based on individual enabling signals so that a number of enabled second digital-to-analog converter cells 130-1, . . . , 130-M is at most 50% (or at most 70%, at most 60% or at most 40%) of a total number of first digital-to-analog converter cells 110-1, . . . , 110-N of the digital-to-analog converter 600.

For example, the digital-to-analog converter 600 may be configured to generate (e.g. by the data generation circuit of the DAC) or receive the individual enabling signals from a signal processing circuit (e.g. a digital signal processor, a base band processor or a central processing unit). The individual enabling signals may be generated so that a number of enabled second digital-to-analog converter cells 130-1, . . . , 130-M varies over time. For example, the individual enabling signals may be generated so that a number of enabled second digital-to-analog converter cells 130-1, . . . , 130-M is lower than the total number of first digital-to-analog converter cells.

For example, the individual enabling signals may be generated so that the number of enabled second digital-to-analog converter cells 130-1, . . . , 130-M is based on a signal parameter of the first digital data 101, for example, a derivative of the first digital data 101, a root-mean-square RMS power of the first analog signal 101, a ratio between peak power of the first analog signal 101 and a constant, and/or a ratio of the peak power of the first analog signal 101 and a multiplication of the peak-to-average power ratio PAPR of the first analog signal 101 and a performance scaling factor. The performance scaling factor may be a value (e.g. integer) indicating a degree of dummy switching. For example, the signal peak power and the PAPR can be tracked over time and the performance scaling factor can be 0 for no dummy switching DSW at all, 1 to cover 68% of the time for gaussian signal distribution (e.g. which is nearly always true for modulated signals) or higher to cover x % of the time according to gaussian distribution of signal amplitudes.

The second digital data 102 may be generated based on the first digital data 101 as the first digital data 101 is indicative of the number of active first digital-to-analog converter cells 110-1, . . . , 110-N for each sample period of the first digital data and/or indicative of the number of first digital-to-analog converter cells 110-1, . . . , 110-N switching between succeeding sample periods of the first digital data.

The data generation circuit 150 may be configured to generate the second digital data 102 such that the second digital data 102 is an appropriate function of the first digital data 101, if the number of activated first digital-to-analog converter cells 110-1, . . . , 110-N is lower than the number of second digital-to-analog converter cells 130-1, . . . , 130-M and/or the number of enabled second digital-to-analog converter cells 130-1, . . . , 130-M. For example, the data generation circuit 150 may be configured to generate the second digital data 102 such that the second digital data 102 is the opposite of the first digital data, if the number of activated first digital-to-analog converter cells 110-1, . . . , 110-N is lower than the number of second digital-to-analog converter cells 130-1, . . . , 130-M and/or the number of enabled second digital-to-analog converter cells 130-1, . . . , 130-M. For example, the opposite of the first digital data 101 may mean that the sum of the first input data codes (e.g. value of the first digital data at a sample period) and second input data codes (e.g. value of the second digital data at the sample period) is constant over several succeeding sample periods (e.g. more than 10, more than 50 or more than 100 sample periods) and/or the sum of first digital-to-analog converter cells 110-1, . . . , 110-N and second digital-to-analog converter cells 130-1, . . . , 130-M switching in or between sample periods is constant over several succeeding sample periods (e.g. more than 10, more than 50 or more than 100 sample periods). Alternatively, the data generation circuit 150 may be configured to generate the second digital data 102 such that a signal value represented by the second digital data 102 corresponds to a constant value minus an absolute signal value represented by the first digital data 101, if the number of activated first digital-to-analog converter cells 110-1, . . . , 110-N is lower than the number of second digital-to-analog converter cells 130-1, . . . , 130-M and/or the number of enabled second digital-to-analog converter cells 130-1, . . . , 130-M. Further alternatively, the data generation circuit 150 may be configured to generate the second digital data 102 such that a temporal progression of a sum of an absolute signal value represented by the second digital data 102 and an absolute signal value represented by the first digital data 101 is constant, if the number of activated first digital-to-analog converter cells 110-1, . . . , 110-N is lower than the number of second digital-to-analog converter cells 130-1, . . . , 130-M and/or the number of enabled second digital-to-analog converter cells 130-1, . . . , 130-M.

For example, the data generation circuit 150 may be configured to generate the second digital data 102 such that a sum of the current supplied to the plurality of first digital-to-analog converter cells 110-1, . . . , 110-N and the current supplied to the plurality of second digital-to-analog converter cells 130-1, . . . , 130-M differs by less than 10% (or less than 20% or less than 5%) from a reference sum current supplied to the first digital-to-analog converter cells 110-1, . . . , 110-N and the plurality of second digital-to-analog converter cells 130-1, . . . , 130-M throughout at least 50% (or at least 60% or at least 70%) of the sample periods of the first digital data 101. The reference sum current may be kept constant or nearly constant as long as sufficient second digital-to-analog converter cells 130-1, . . . , 130-M may be available (e.g. enabled or present) for dummy switching. Additionally, the sum of the current supplied to the plurality of first digital-to-analog converter cells 110-1, . . . , 110-N and the current supplied to the plurality of second digital-to-analog converter cells 130-1, . . . , 130-M may differ by more than 10% (e.g. but still less than 80%, less than 60%, less than 50% or less than 40%) from the reference sum current, if the number of activated first digital-to-analog converter cells 110-1, . . . , 110-N is higher than the total number of second digital-to-analog converter cells 130-1, . . . , 130-M and/or the number of enabled second digital-to-analog converter cells 130-1, . . . , 130-M. This might not be the case, if the number of activated first digital-to-analog converter cells 110-1, . . . , 110-N is higher than the total number of second digital-to-analog converter cells 130-1, . . . , 130-M and the number of enabled second digital-to-analog converter cells 130-1, . . . , 130-M. For example, the DAC may comprise 512 first digital-to-analog converter cells and 256 second digital-to-analog converter cells. If 257 first digital-to-analog converter cells are active, current may be different by ⅟₅₁₂, well below 10%.

For example, the data generation circuit 150 may be configured to generate the second digital data 102 such that a sum of first digital-to-analog converter cells 110-1, . . . , 110-N and second digital-to-analog converter cells 130-1, . . . , 130-M switching between directly succeeding sample periods of the first digital data 101 differs by less than 10% (or less than 20% or less than 5%) from a reference number of switching cells throughout at least 50% (or at least 60% or at least 70%) of the sample periods of the first digital data 101. In this way, the total switching current of the DAC may be kept constant or nearly constant for most of the time. Additionally, the sum of first digital-to-analog converter cells 110-1, . . . , 110-N and second digital-to-analog converter cells 130-1, . . . , 130-M switching between succeeding sample periods of the first digital data may differ by more than 10% (e.g. but still less than 80%, less than 60%, less than 50% or less than 40%) from the reference number of switching cells, if the number of first digital-to-analog converter cells 110-1, . . . , 110-N switching between succeeding sample periods is higher than the total number of second digital-to-analog converter cells 130-1, . . . , 130-M and/or the number of enabled second digital-to-analog converter cells 130-1, . . . , 130-M. This might not be the case, if the number of activated first digital-to-analog converter cells 110-1, . . . , 110-N is higher than the total number of second digital-to-analog converter cells 130-1, . . . , 130-M and the number of enabled second digital-to-analog converter cells 130-1, . . . , 130-M. For an OFDM example with ¼ of cells dummy switching, because of CF/PAPR=12 dB, the current might be constant for 68% of the time. But the peak current taken may be a normalized 1, the current range covered by dummy switching would only be 0.25, so there might be a difference of a factor of 4 between the current when the dummy switching range is sufficient and when the signal is out of the range. This explanation is probably more valid for the current due to signal than for switching, but also on switching there could be a bigger difference than 60%. With low oversampling and big signal dynamics, there may be a factor >2 and/or close to 4.

Additionally or alternatively, the second digital data 102 may be generated based on a random parameter. The random parameter may be a random or pseudo-random number or a value determined based on a random or pseudo-random number (e.g. a constant offset value plus a random number). For example, the data generation circuit 150 may be configured to generate the second digital data 102 based on the random parameter such that a number of second digital-to-analog converter cells 130-1, . . . , 130-M switching between directly succeeding sample periods of the first digital data 101 varies randomly.

The sample period of the first digital data 101 may be the time interval during which the first digital data 101 has a value before changing to the next value of the next sample period. The sample period of the first digital data 101 may also be called cycle period, clock period or sampling clock period.

The first digital data 101 may represent payload data to be converted to an analog signal, for example for transmitting the payload data wirelessly or through a wired connection. The first digital data 101 may comprise values so that the first analog signal varies between 0 and a maximal signal amplitude over time. The maximal signal amplitude of the first analog signal 101 may be generated, if all first digital-to-analog converter cells 110-1, . . . , 110-N may be active.

An active digital-to-analog converter cell (e.g. first or second digital-to-analog converter cell) may be a converter cell adding an analog quantity to the corresponding output node (e.g. pulling the output node towards a supply via a defined impedance, delivering current into an output node, and/or delivering charge into an output node). An inactive digital-to-analog converter cell (e.g. first or second digital-to-analog converter cell) may be a converter cell not contributing or subtracting an analog quantity from a corresponding output node (e.g. pulling the output node towards a reference voltage (e.g. ground) via a defined impedance, pulling current from an output node, and/or subtracting charge from an output node). An enabled digital-to-analog converter cell may be a converter cell that is able to be activated or deactivated, while a disabled digital-to-analog converter cell cannot be activated and/or might be disconnected from the respective output node and/or in general is not able to process digital input data.

The first digital-to-analog converter cells 110-1, . . . , 110-N may be active or deactivated based on a thermometer coded signal derived from the first digital data 101 or the first digital data 101 may already be a thermometer coded signal. The second digital-to-analog converter cells 130-1, . . . , 130-M may be active or deactivated based on a thermometer coded signal derived from the second digital data 102 or the second digital data 102 may already be a thermometer coded signal.

Each second digital-to-analog converter cells 130-1, . . . , 130-M of the plurality of second digital-to-analog converter cells may provide an independent second analog signal to an individual second output node. The second output nodes of the second digital-to-analog converter cells 130-1, . . . , 130-M might not be connected to each other. The second output nodes of the second digital-to-analog converter cells 130-1, . . . , 130-M may be connected to individual second loads (e.g. dummy loads) or may be floating as the second analog signals (e.g. analog dummy signals) might not be further used or processed. Alternatively, all or some second digital-to-analog converter cells 130-1, ..., 130-M of the plurality of second digital-to-analog converter cells may be connected to a mutual second output node, which may be floating or may be connected to a second load (e.g. dummy load). The one or more second loads may couple the one or more second output nodes to a reference potential (e.g. ground). The cell drivers and/or loads may also be connected differentially or pseudo differentially instead of single-ended.

The data generation circuit 150 may be part of the digital-to-analog converter 600 as shown in FIG. 6 or may be part of a signal processing circuit connected or connectable to an input of the digital-to-analog converter 600. The mutual power supply 180 may be part of the digital-to-analog converter 600 as shown in FIG. 6 or may be connected or connectable to the power supply node 185 of the digital-to-analog converter 600.

More details and aspects are mentioned in connection with the embodiments described above or below. For example, more details of the plurality of first digital-to-analog converter cells, the plurality of second digital-to-analog converter cells and/or the data generation circuit may be described in connection with FIG. 1. The digital-to-analog converter 600 shown in FIG. 6 may comprise one or more optional additional features corresponding to one or more aspects mentioned in connection with the proposed concept of one or more embodiments described above or below (e.g. FIGS. 1-5b and/or 7-17).

Figure 7:
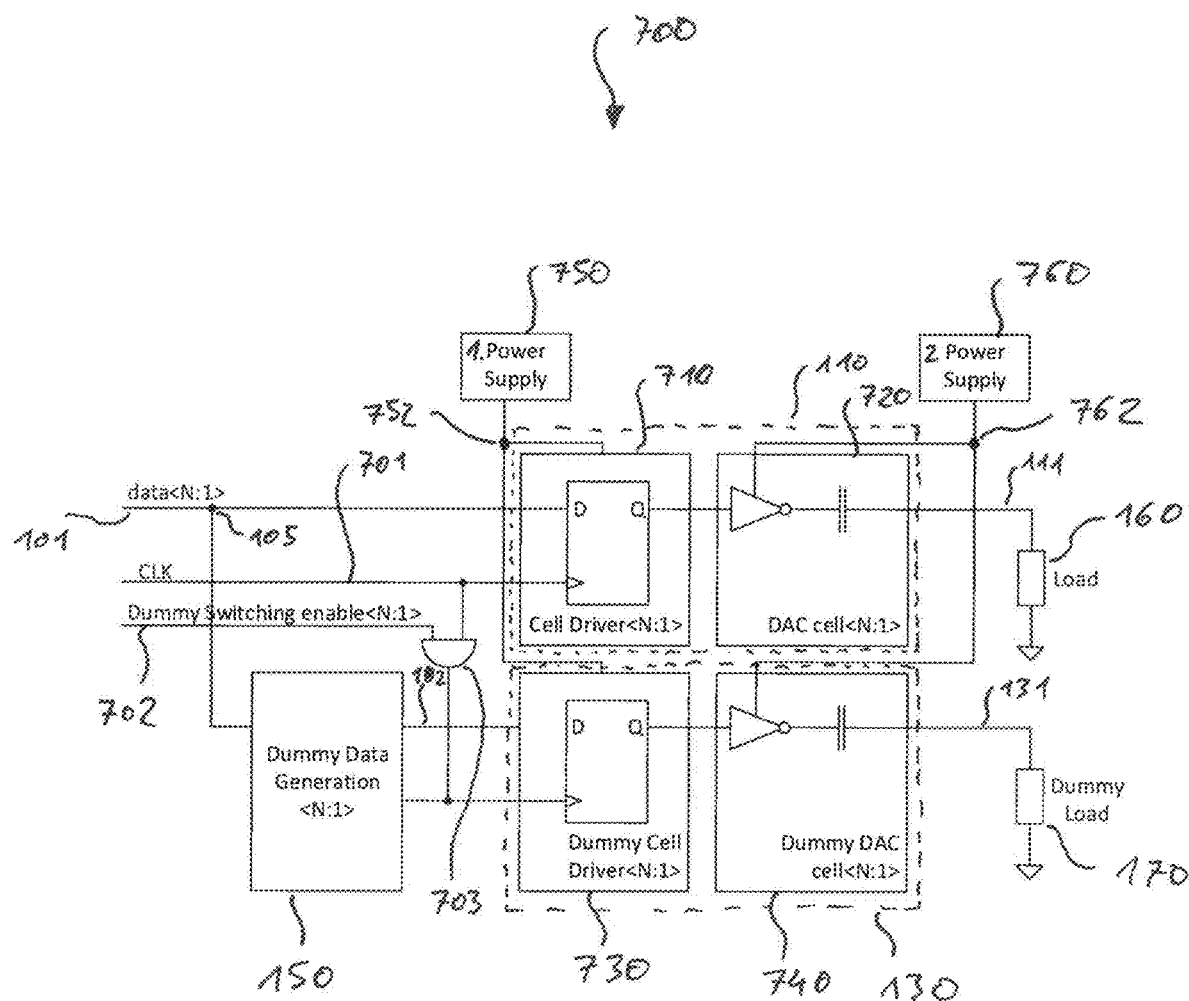
FIG. 7 is a schematic illustration of a part of another digital-to-analog converter.

FIG. 7 shows a schematic illustration of a digital-to-analog converter according to an example. The digital-to-analog converter 700 may be implemented similar to the digital-to-analog converter described in connection with FIG. 6. For example, each first digital-to-analog converter cell 110 of the plurality of first digital-to-analog converter cells and each second digital-to-analog converter cell 130 of the plurality of second digital-to-analog converter cells comprises a driver circuit and a cell circuit. The driver circuits 710 of the plurality of first digital-to-analog converter cells 110 and the driver circuits 730 of the plurality of second digital-to-analog converter cells 130 are connected to a first power supply node 752 for coupling to a first mutual power supply 750. The cell circuits 720 of the plurality of first digital-to-analog converter cells 110 and the cell circuits 740 of the plurality of second digital-to-analog converter cells 130 are connected to a second power supply node 762 for coupling to a second mutual power supply 760. The first power supply node 752 may be electrically insulated from the second power supply node 762. In this way, undesired variation of the supply voltage at one supply node might not affect the voltage at the other supply node.

The driver circuit 710 of the first digital-to-analog converter cell 110 and the driver circuit 730 of the second digital-to-analog converter cell 130 may comprise a D flip-flop. The first digital data 101 or a signal derived from the first digital data 101 (e.g. thermometer coded signal) may be provided to the D input of the D flip-flop of the driver circuit 710 of the plurality of first digital-to-analog converter cell 110 and the second digital data 102 or a signal derived from the second digital data 102 (e.g. thermometer coded signal) may be provided to the D input of the D flip-flop of the driver circuit 730 of the second digital-to-analog converter cell 130. A clock signal 703 may be provided to the clock input of the D flip-flop of the driver circuit 710 of the first digital-to-analog converter cells 110. An individual enabling signal 702 (e.g. dummy switching enable) may be provided to a first input of an AND-gate 703 and the clock signal 701 may be provided to a second input of the AND-gate 703. The output of the AND-gate 703 may be provided to the clock input of the D flip-flop of the driver circuit 730 of the second digital-to-analog converter cell 130. Additionally, the data generation circuit 150 may be connected to the clock input of the D flip-flop of the driver circuit 730 of the second digital-to-analog converter cell 130, for example for additional control of enablement of the second digital-to-analog converter cell 130. Further, a data output (e.g. providing the second digital data 102) of the data generation circuit 150 may be connected to the D input of the D flip-flop of the driver circuit 730 of the second digital-to-analog converter cell 130. The Q output of the D flip-flop of the driver circuit 710 of the plurality of first digital-to-analog converter cell 110 is connected to an input of the cell circuit 720 of the first digital-to-analog converter cells 110 and the Q output of the D flip-flop of the driver circuit 730 of the plurality of second digital-to-analog converter cell 130 is connected to an input of the cell circuit 740 of the second digital-to-analog converter cell 130.

The first mutual power supply 750 and the second mutual power supply 760 may be independent hardware units or may be part of a general power supply device with two or more power supply units. For example, the first mutual power supply 750 and the second mutual power supply 760 may be connected or connectable to the digital-to-analog converter 700.

For example, FIG. 7 may show an implementation allowing to adapt the number of cells performing dummy switching. For example, FIG. 7 may show a CDAC with partial dummy switching. The DAC may comprise the main signal path data <N:1> to cell driver <N:1> to DAC cell <N:1> into the DAC load 160. The DAC load 160 may be a resistor, a matching network, a PA input, a mixer or similar. The lower half of FIG. 7 may show the dummy path including dummy data generation, 150 a dummy cell driver 730 and a dummy DAC cell 740 driving into a dummy load 170.

DAC cells (cell circuits of first of first digital-to-analog converter cells) and dummy DAC cells (cell circuits of second digital-to-analog converter cells) may be connected to the same supply. In this way, the supply current drawn by the dummy cells may make the current on the DAC cell supply signal independent. The cell driver (driver circuit of first of first digital-to-analog converter cells), which can be a register or series of registers and logic gates, and the dummy cell driver (driver circuit of second of first digital-to-analog converter cells) are connected to a second supply for the driver circuits. In this way, the supply current drawn by the dummy cell drivers may make the current on the driver supply signal independent.

The characteristic of supply currents of the DAC cells and the cell drivers can be different. The characteristic of the cell current was described before (e.g. rectification or polynomial fit). For example, the cell drivers consume current when changing state, means, are switching. The switching activity may be proportional to the derivative of the input signal. The generated dummy data (second digital data) can be different depending on which supply current should be signal independent. Ideally, the dummy data may be generated in a way that both signal current through the cells and current due to switching activity is signal independent. The supply of the DAC cells and the cell driver might be one single supply.

More details and aspects are mentioned in connection with the embodiments described above or below. The digital-to-analog converter 700 shown in FIG. 7 may comprise one or more optional additional features corresponding to one or more aspects mentioned in connection with the proposed concept of one or more embodiments described above or below (e.g. FIGS. 1-6 and/or 8-17).

Figure 8:
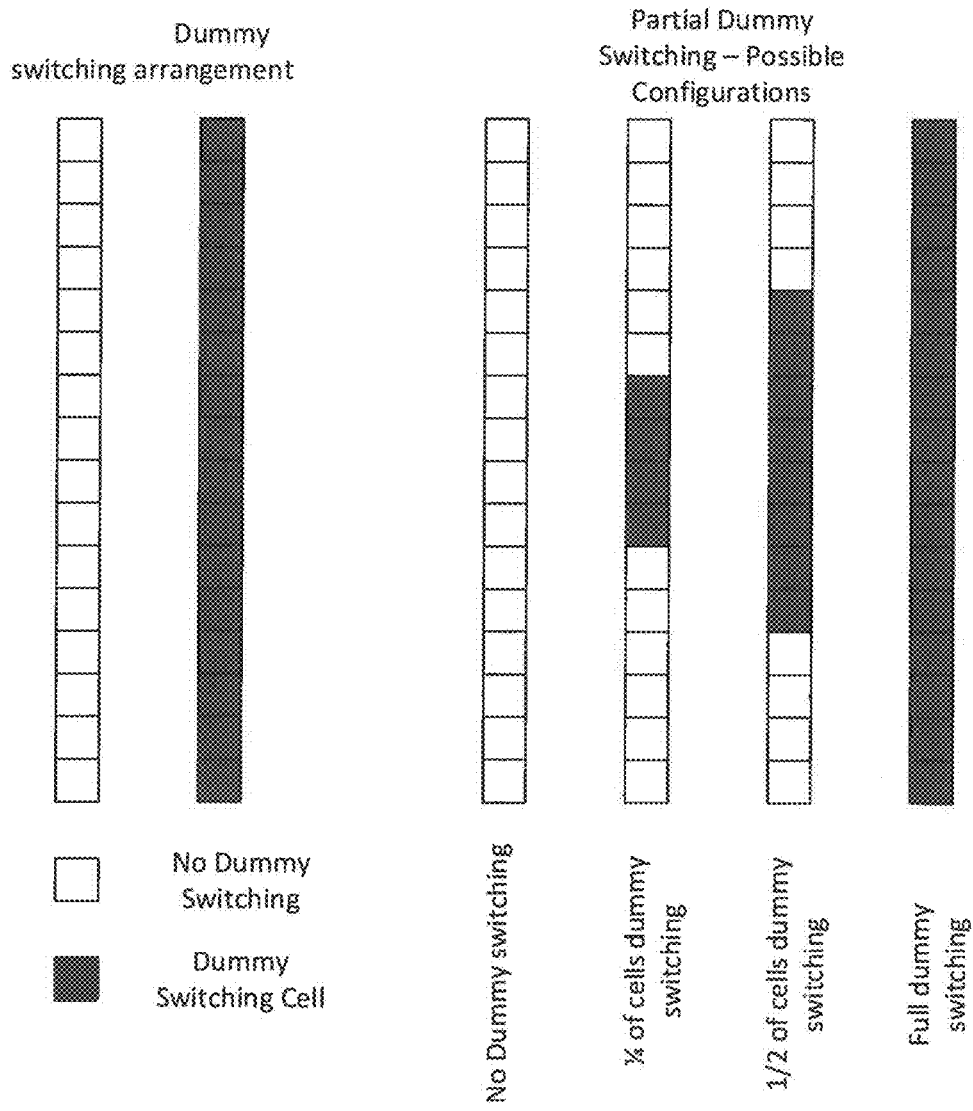
FIG. 8 is a comparison of a configuration for switching all dummy cells and a partial dummy switching configuration.

FIG. 8 shows a comparison of a configuration for switching all dummy cells and a partial dummy switching configuration. The left part of FIG. 8 shows a concept with no dummy switching (e.g. DAC without dummy cells) and with full dummy switching (e.g. each normal cell has a corresponding dummy cell which does dummy switching). The right part of FIG. 8 shows a concept with partial dummy switching with four different configurations. The DAC may comprise the same number of dummy cells as normal cells, but the dummy cells can be individually enabled. In a first configuration, no dummy cell is enabled for dummy switching, in a second configuration 25% of the cells are enabled for dummy switching, in a third configuration 50% of the cells are enabled for dummy switching, and in a fourth configuration all of the cells are enabled for dummy switching. For example, the DAC may be able to switch between the four configurations.

For example, FIG. 8 may show a dummy switching arrangement for a thermometer coded DAC array.

Figure 9A:
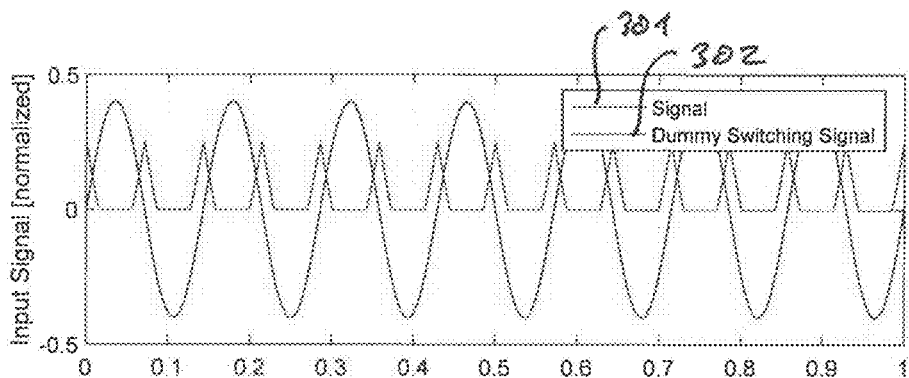
FIG. 9a is a diagram of the normalized signal value of a first digital signal and the normalized signal value of a second digital signal over time.
Figure 9B:
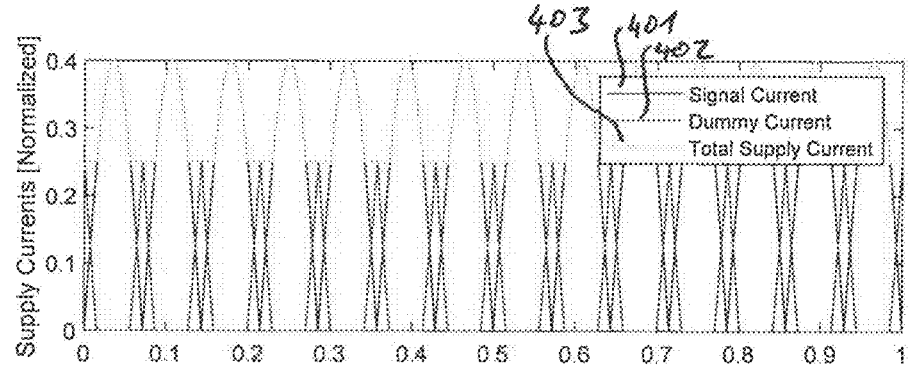

FIG. 9a shows a diagram of the normalized signal value 301 of the first digital signal 101 and the normalized signal value 302 of the second digital signal 102 (e.g. dummy switching signal) over time. FIGS. 9a and 9b show an example of partial dummy switching with Ndsw=½N with possible partial dummy switching signals and the resulting supply current. In this case, the number of cells able to do dummy switching Ndsw (e.g. number of enabled second digital-to-analog converter cells) is set to half of the full set of cells N (e.g. number of first digital-to-analog converter cell).

FIG. 9b shows a diagram of the normalized supply current 401 drawn by the first DAC cells, the normalized supply current 402 drawn by the enabled second DAC cells and the total supply current 403 (sum of the current supplied to the plurality of first digital-to-analog converter cells and the current supplied to the plurality of second digital-to-analog converter cells) over time.

Figure 9C:
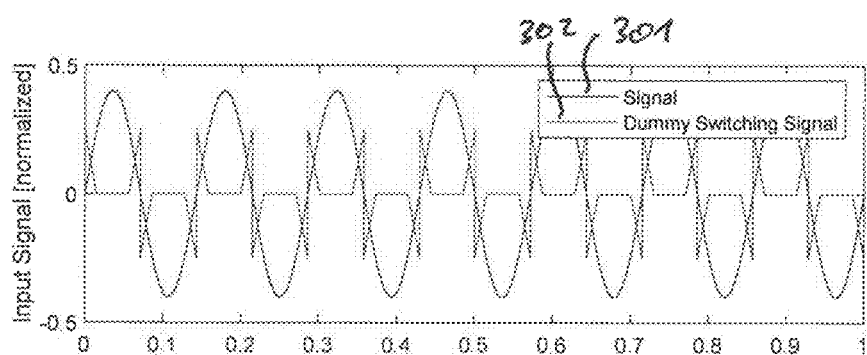
FIG. 9c is another diagram of the normalized signal value of a first digital signal and the normalized signal value of a second digital signal over time.
Figure 9D:
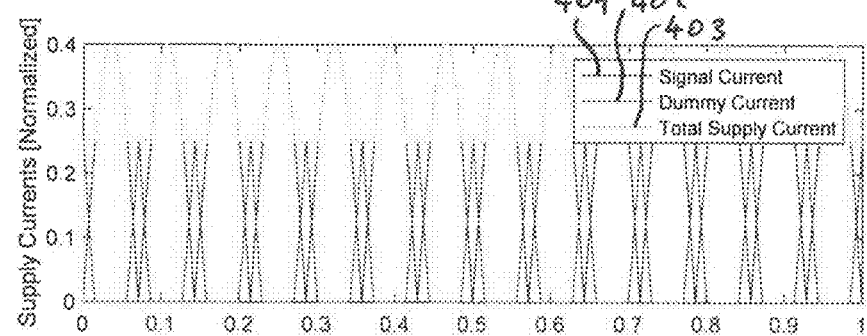
FIG. 9d is another diagram of the normalized supply current drawn by the first DAC cells, the normalized supply current drawn by the enabled second DAC cells and the total supply current over time corresponding to FIG. 9c.

FIGS. 9c and 9d show another example of partial dummy switching with Ndsw=½N resulting in the same supply current, just with different generation of the dummy switching signal (second digital data).

Figure 9E:
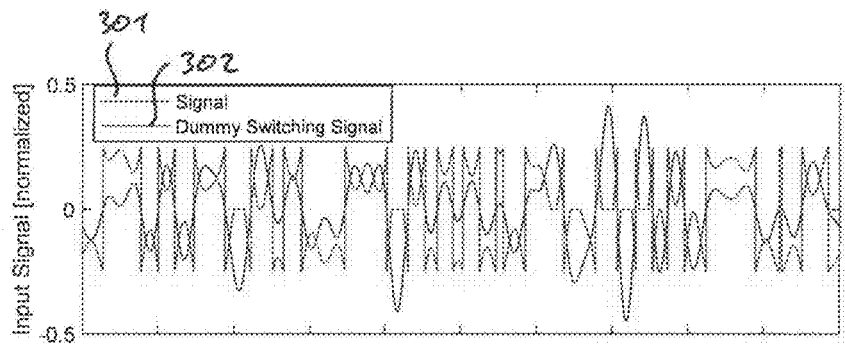
FIG. 9e is another diagram of the normalized signal value of a first digital signal and the normalized signal value of a second digital signal over time.
Figure 9F:
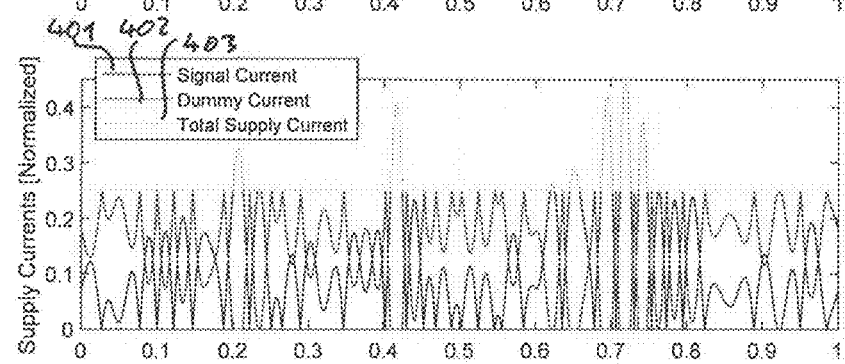
FIG. 9f is another diagram of the normalized supply current drawn by the first DAC cells, the normalized supply current drawn by the enabled second DAC cells and the total supply current over time corresponding to FIG. 9e.

The improvement may be clearer when looking to an OFDM signal. FIGS. 9e and 9f show an example of Partial Dummy Switching on an OFDM signal with Ndsw=½N. The signal, dummy switching signal and resulting supply currents in case of an OFDM signal with only a few tones is shown. It can be seen that the signal current is constant for most of the time and only following the signal for short amount of time. The number of dummy switching cells can be set depending on how such transient currents affect performance and how much performance degradation is tolerable compared to full DSW (dummy switching).

Figures 10A, 10B:
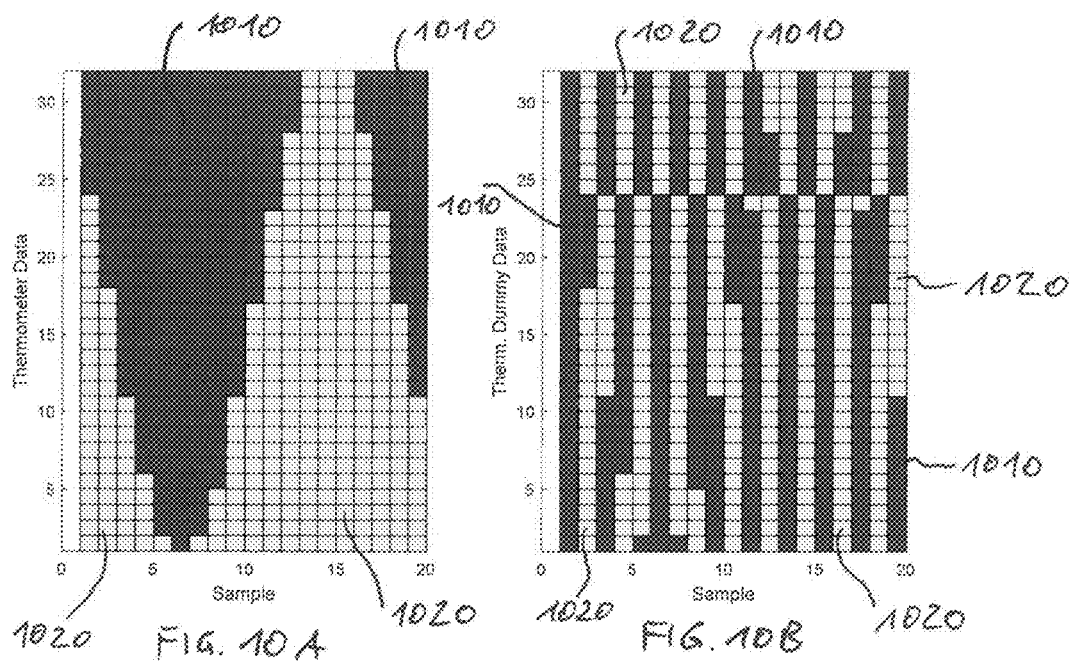

A switching scheme that shows constant switching activity, but not constant signal current is shown in FIG. 10a and 10b. FIG. 10a shows the thermometer data for several samples of the first digital signal. For light colored squares 1020 (e.g. each representing a first digital-to-analog converter cell), the thermometer data is generated to activate the corresponding first digital-to-analog converter cell for the corresponding sample, and for dark colored squares 1010, the thermometer data is generated to deactivate the corresponding first digital-to-analog converter cell for the corresponding sample. FIG. 10b shows the thermometer dummy data (e.g. second digital data) for several samples of the first digital signal. For light colored squares 1020 (e.g. each representing a second digital-to-analog converter cell), the thermometer dummy data is generated to activate the corresponding second digital-to-analog converter cell for the corresponding sample, and for dark colored squares 1010, the thermometer dummy data is generated to deactivate the corresponding second digital-to-analog converter cell for the corresponding sample. FIG. 10a and 10b may be an example for a constant switching activity dummy switching scheme. Such a scheme would try to always have the same amount of cells (sum of normal cells and dummy cells) changing state and could, therefore, cause signal independent current on the cell driver supply.

Figure 10C:
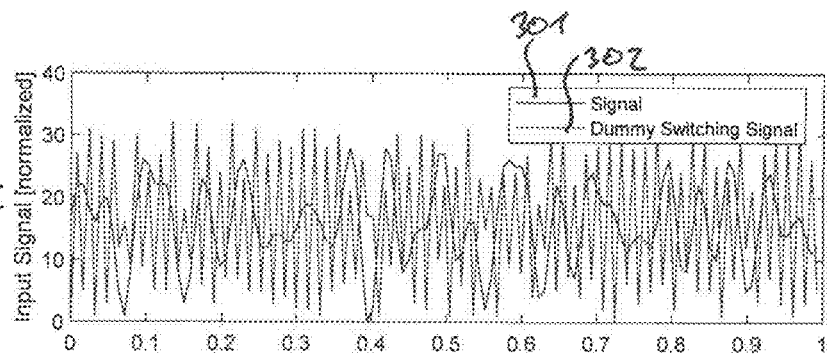
FIG. 10c is a diagram of the normalized signal value of a first digital signal and the normalized signal value of a second digital signal over time corresponding to the example shown in FIGS. 10a and 10b.
Figure 10D:
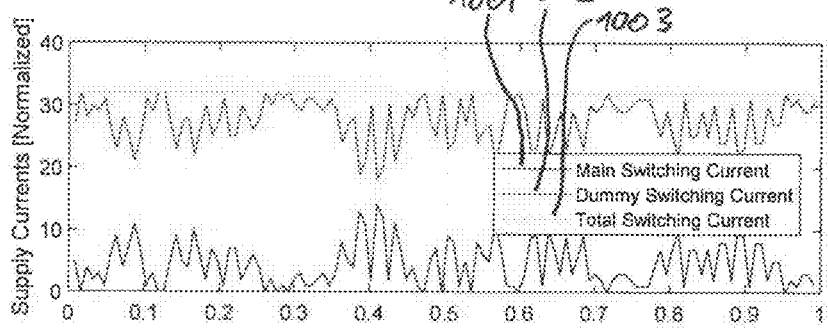
FIG. 10d is a diagram of the normalized main switching current drawn by the first DAC cells, the normalized dummy switching current drawn by the enabled second DAC cells and the total switching current over time corresponding to FIG. 10c.

The according signals and supply currents can be seen in FIGS. 10c and 10d, which show a constant switching current dummy switching example. FIG. 10c shows a diagram of the normalized signal value 301 of the first digital signal 101 and the normalized signal value 302 of the second digital signal 102 (e.g. dummy switching signal) over time. FIG. 10d shows a diagram of the normalized main switching current 1001 drawn by the first DAC cells, the normalized dummy switching current 1002 drawn by the enabled second DAC cells and the total switching current 1003 (sum of the current supplied to the plurality of first digital-to-analog converter cells and the current supplied to the plurality of second digital-to-analog converter cells) over time.

Figure 11A:
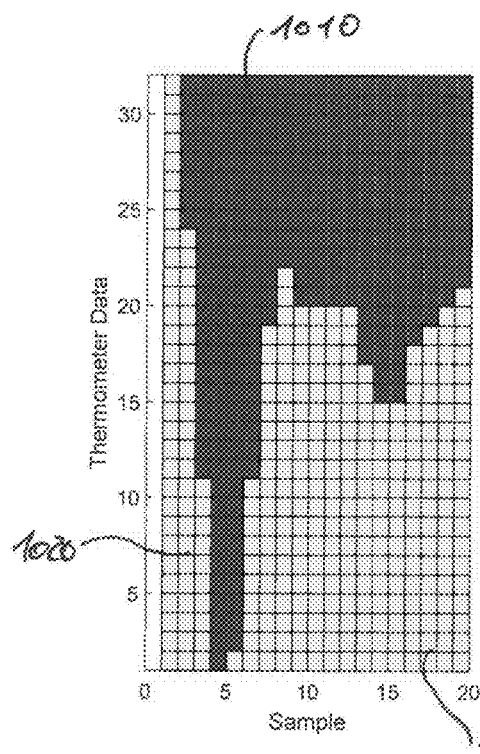
FIG. 11a is the thermometer data for several samples of a first digital signal.
Figure 11B:
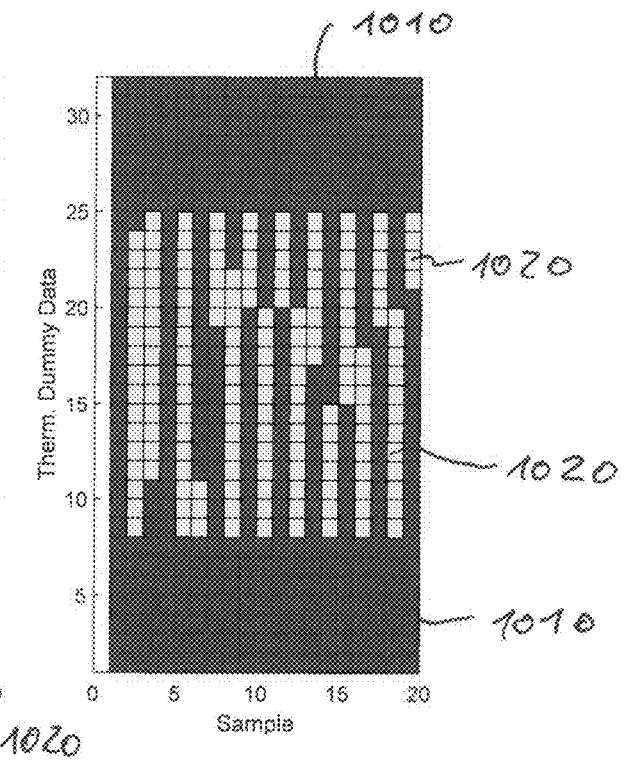

Applying partial dummy switching with again Ndsw=½N (e.g. only half of the cells with dummy switching) results in waveforms as shown in FIG. 11a-11d. FIGS. 11a and 11b show an example of partial dummy switching for constant switching activity for a 5 bit Thermometer coded array. FIG. 11a shows the thermometer data for several samples of the first digital signal. For light colored squares 1020 (e.g. each representing a first digital-to-analog converter cell), the thermometer data is generated to activate the corresponding first digital-to-analog converter cell for the corresponding sample, and for dark colored squares 1010, the thermometer data generated is to deactivate the corresponding first digital-to-analog converter cell for the corresponding sample. FIG. 11b shows the thermometer dummy data (e.g. second digital data) for several samples of the first digital signal. For light colored squares 1020 (e.g. each representing a second digital-to-analog converter cell), the thermometer dummy data is generated to activate the corresponding second digital-to-analog converter cell for the corresponding sample, and for dark colored squares 1010, the thermometer dummy data is generated to deactivate the corresponding second digital-to-analog converter cell for the corresponding sample.

Figure 11C:
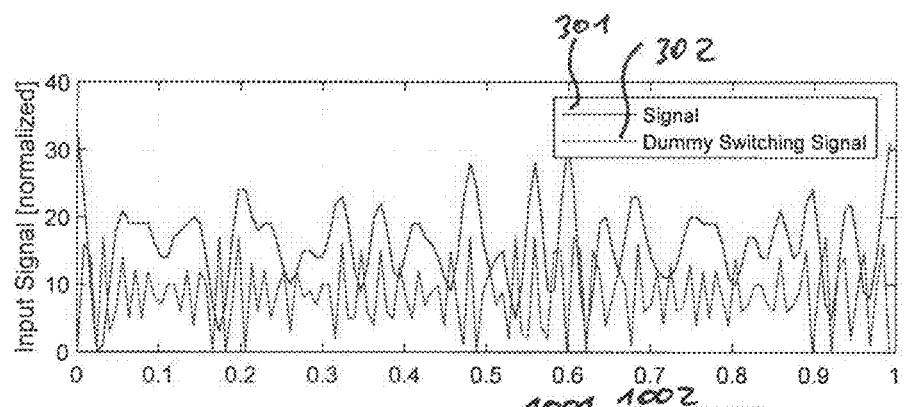
FIG. 11c is a diagram of the normalized signal value of a first digital signal and the normalized signal value of a second digital signal over time corresponding to the example shown in FIGS. 11a and 11b.
Figure 11D:
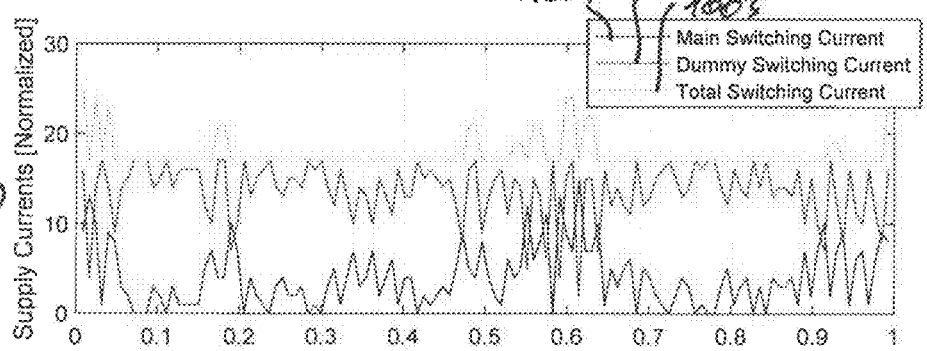
FIG. 11d is a diagram of the normalized main switching current drawn by the first DAC cells, the normalized dummy switching current drawn by the enabled second DAC cells and the total switching current over time corresponding to FIG. 11c.

The according signals and supply currents can be seen in FIGS. 11c and 11d, which show a partial dummy switching for constant switching activity with Ndsw=½N. FIG. 11c shows a diagram of the normalized signal value 301 of the first digital signal 101 and the normalized signal value 302 of the second digital signal 102 (e.g. dummy switching signal) over time. FIG. 11d shows a diagram of the normalized main switching current 1001 drawn by the first DAC cells, the normalized dummy switching current 1002 drawn by the enabled second DAC cells and the total switching current 1003 (sum of the current supplied to the plurality of first digital-to-analog converter cells and the current supplied to the plurality of second digital-to-analog converter cells) over time.

The way dummy switching data is generated may be selected depending on which effect is the main contributor of the performance degradation to be tackled with the dummy switching approach. Also, the level of dummy switching in the partial dummy switching scheme might be set by design or set by reconfiguration (e.g. programming) depending on the use case, input data, expected performance and may be adapted dynamically based on signal properties.

Figures 12A, 12B:
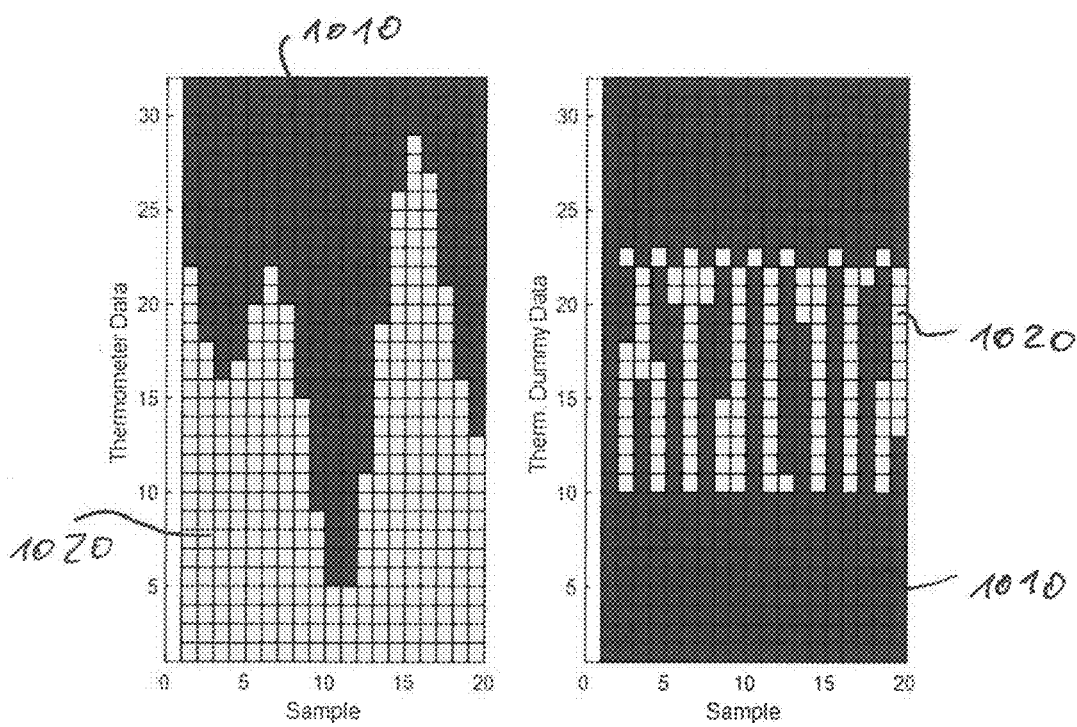

FIGS. 12a and 12b show an example for the case of a constant number of dummy cells Ndsw=12 out of a number of normal cells N=32. FIG. 12a shows the thermometer data for several samples of the first digital signal. For light colored squares 1020 (e.g. each representing a first digital-to-analog converter cell), the thermometer data is generated to activate the corresponding first digital-to-analog converter cell for the corresponding sample, and for dark colored squares 1010, the thermometer data generated is to deactivate the corresponding first digital-to-analog converter cell for the corresponding sample. FIG. 12b shows the thermometer dummy data (e.g. second digital data) for several samples of the first digital signal. For light colored squares 1020 (e.g. each representing a second digital-to-analog converter cell), the thermometer dummy data is generated to activate the corresponding second digital-to-analog converter cell for the corresponding sample, and for dark colored squares 1010, the thermometer dummy data is generated to deactivate the corresponding second digital-to-analog converter cell for the corresponding sample.

Figure 12C:
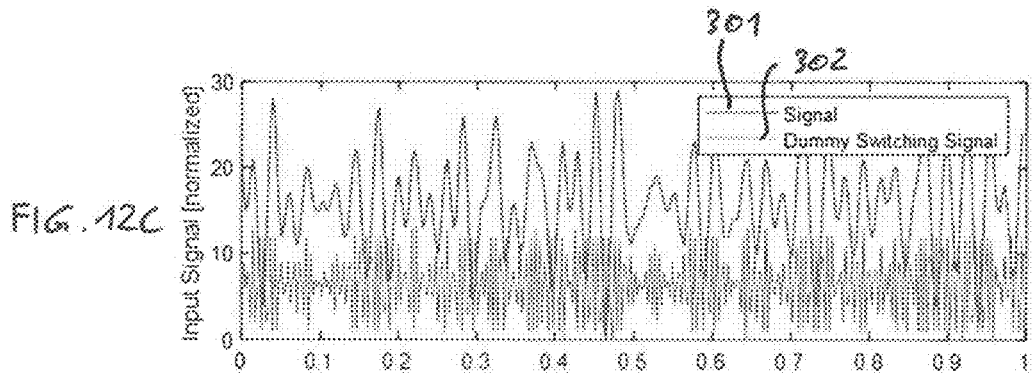
FIG. 12c is a diagram of the normalized signal value of a first digital signal and the normalized signal value of a second digital signal over time corresponding to the example shown in FIGS. 12a and 12b.
Figure 12D:
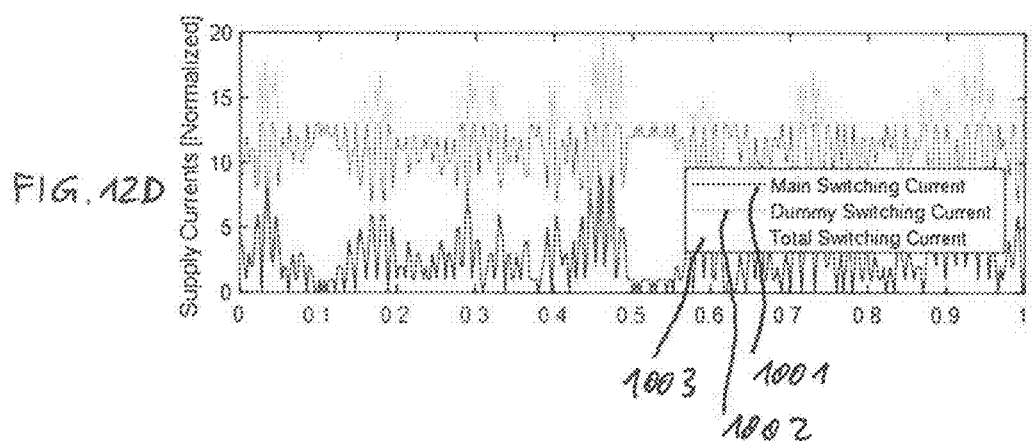
FIG. 12d is a diagram of the normalized main switching current drawn by the first DAC cells, the normalized dummy switching current drawn by the enabled second DAC cells and the total switching current over time corresponding to FIG. 12c.

FIG. 12c shows a diagram of the normalized signal value 301 of the first digital signal 101 and the normalized signal value 302 of the second digital signal 102 (e.g. dummy switching signal) over time. FIG. 12d shows a diagram of the normalized main switching current 1001 drawn by the first DAC cells, the normalized dummy switching current 1002 drawn by the enabled second DAC cells and the total switching current 1003 (sum of the current supplied to the plurality of first digital-to-analog converter cells and the current supplied to the plurality of second digital-to-analog converter cells) over time.

The result may be a switching current that is constant for most of the time and only following the signal when the signal is out of the dummy cell range.

Figure 13A:
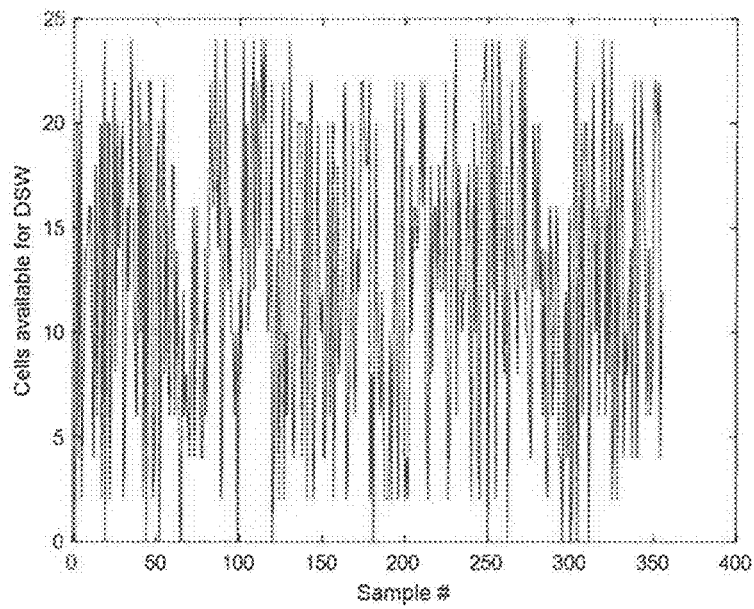
FIG. 13a is a diagram showing available cells for dummy switching (DSW) vs time.

By varying the number of switching dummy cells randomly or at least partially randomly, the analog output signal may be made independent or partially independent from the digital input data. The number of cells for dummy switching may change randomly vs time. FIG. 13a shows an example of a random number of cells available over time. On average, the same amount of cells is available for dummy switching DSW (e.g. 12) as in FIG. 12b, but the range is from 0 to 24.

Figure 13B:
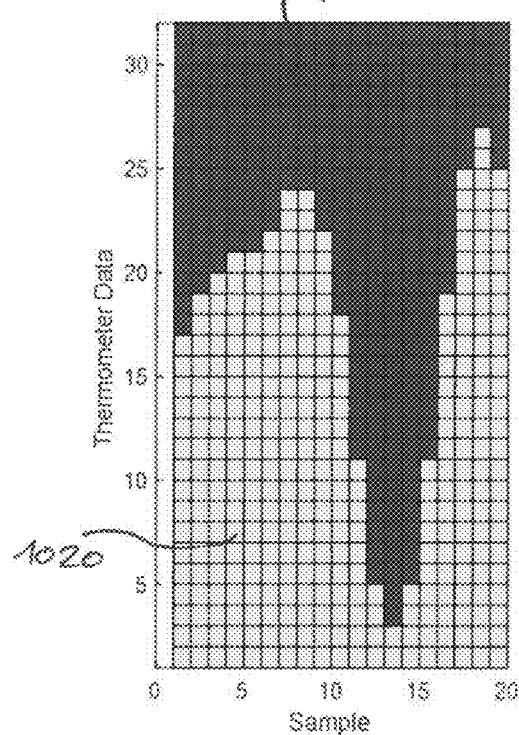
FIG. 13b is the thermometer data for several samples of a first digital signal.
Figure 13C:
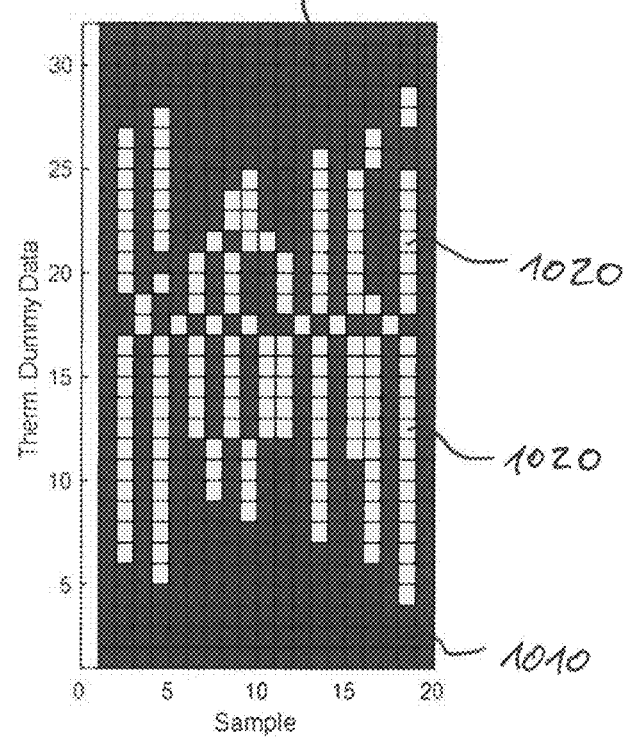
FIG. 13c is the thermometer dummy data for several samples of the first digital signal of FIG. 13b.
Figure 13D:
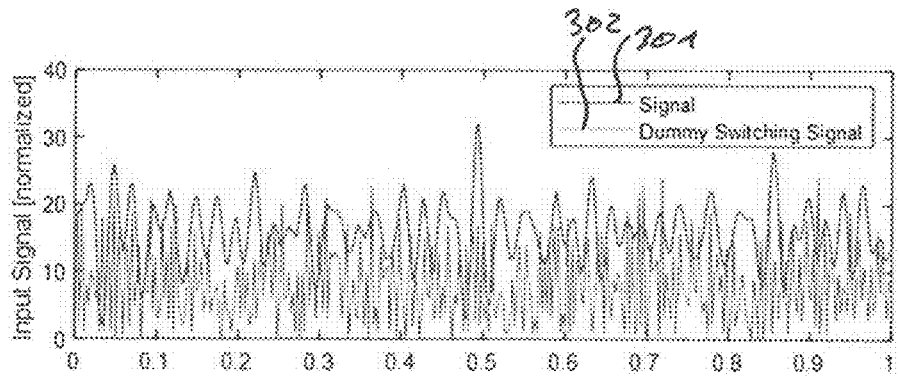
FIG. 13d is a diagram of the normalized signal value of a first digital signal and the normalized signal value of a second digital signal over time corresponding to the example shown in FIGS. 13b and 13c.
Figure 13E:
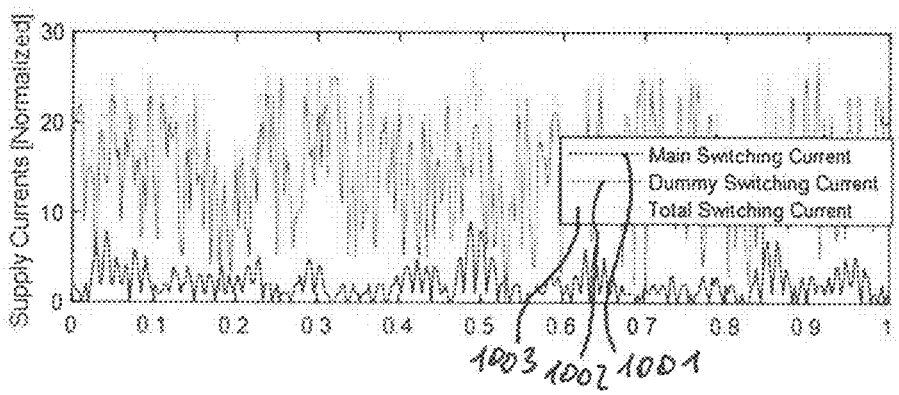
FIG. 13e is a diagram of the normalized main switching current drawn by the first DAC cells, the normalized dummy switching current drawn by the enabled second DAC cells and the total switching current over time corresponding to FIG. 13d.

FIG. 13b shows the thermometer data for several samples of the first digital signal. For light colored squares 1020 (e.g. each representing a first digital-to-analog converter cell), the thermometer data is generated to activate the corresponding first digital-to-analog converter cell for the corresponding sample, and for dark colored squares 1010, the thermometer data generated is to deactivate the corresponding first digital-to-analog converter cell for the corresponding sample. FIG. 13c shows the thermometer dummy data (e.g. second digital data) for several samples of the first digital signal. For light colored squares 1020 (e.g. each representing a second digital-to-analog converter cell), the thermometer dummy data is generated to activate the corresponding second digital-to-analog converter cell for the corresponding sample, and for dark colored squares 1010, the thermometer dummy data is generated to deactivate the corresponding second digital-to-analog converter cell for the corresponding sample. FIG. 13d shows a diagram of the normalized signal value 301 of the first digital signal 101 and the normalized signal value 302 of the second digital signal 102 (e.g. dummy switching signal) over time. FIG. 13e shows a diagram of the normalized main switching current 1001 drawn by the first DAC cells, the normalized dummy switching current 1002 drawn by the enabled second DAC cells and the total switching current 1003 (sum of the current supplied to the plurality of first digital-to-analog converter cells and the current supplied to the plurality of second digital-to-analog converter cells) over time.

In this example, the switching current looks very random and has a very low correlation to the input signal (first digital data).

In another implementation the number of cells could randomly change around a mean value with limited variability. For example, the number of enabled switching cells Ndsw=12+round(6*rand( )) with the mean value being 12 and rand( ) is a random value between −1 and 1, which changes for every sample period of the input signal (first digital data).

Figure 14:
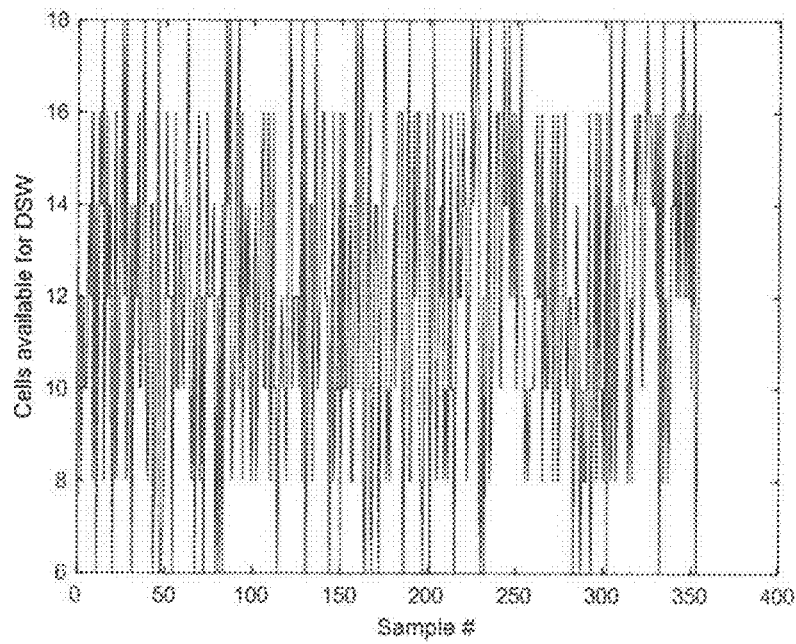
FIG. 14 is a diagram showing available cells for dummy switching (DSW) vs time.

FIG. 14 shows an example of a random number of cells available for dummy switching over time according to Ndsw=12+round(6*rand( )). The current may be again signal decorrelated, but with lower variability compared to higher random amount on Ndsw.

Varying the number of dummy switching cells over time may be a possibility. The number may be changed in many ways (e.g. with a constant value+small random part, predictive change with a slowly changing number vs time, up to the example of fully random).

Some examples relate to a partial dummy switching in a capacitive D/A-converter. For example, dummy DAC cells may be added and terminated by dummy loads. Means for dummy data generation may be provided. The dummy cells may be driven by data to generate at least partially signal independent supply current. The level of dummy switching may be adapted according to the signal level the DAC is receiving.

Compared to the full dummy switching approach, partial dummy switching can improve linearity at much lower power overhead.

For example, in communication systems, the input signal to a TX DAC (transmitter DAC) may have a low RMS (root-mean-square) power compared to the DAC full scale. This may mean that most of the time very small signal amplitudes may be generated by the DAC. High amplitudes may occur only rarely. Having the DAC perform dummy switching for only a part of it's full scale range may, therefore, result in a signal independent supply current for most of the time.

Figure 15:
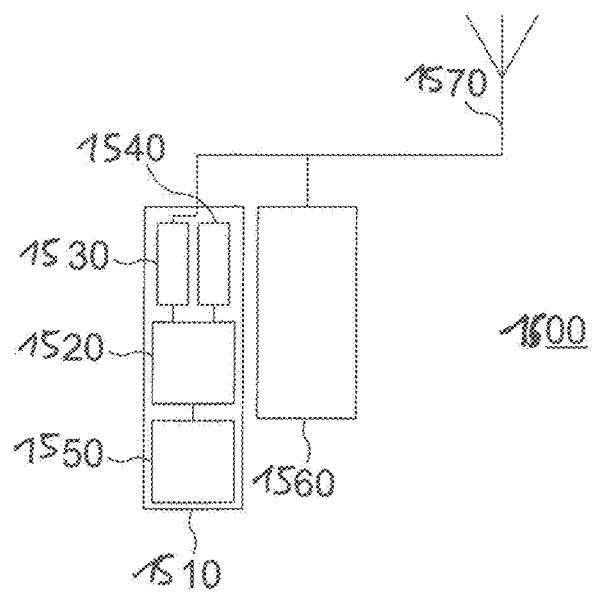
FIG. 15 illustrates an example of a base station.

An example of an implementation using a DAC according to one or more aspects of the architecture described above or one or more examples described above is illustrated in FIG. 15. FIG. 15 schematically illustrates an example of a radio base station 1500 (e.g. for a femtocell, a picocell, a microcell or a macrocell) comprising a DAC 1520 as proposed.

The DAC 1520 is part of a transmitter 1510 (being an example for a data processing system). The transmitter 1520 additionally comprises digital circuitry 1550 (e.g. a Digital Signal Processor, DSP) configured to supply the first digital data to the DAC 1520. For example, the digital circuitry 1550 may be configured to generate the first digital data based on data to be wirelessly transmitted.

The base station 1500 comprises at least one antenna element 1570 coupled to the transmitter 1510 for radiating one or more Radio Frequency (RF) transmit signals that are based on the DAC output to the environment. For example, the DAC 1520 may be coupled to the antenna element 1570 via one or more intermediate elements 1530 such as a filter, an up-converter (mixer) or a PA. The one or more intermediate elements 1530 and/or the antenna element 1570 may be understood as exemplary loads coupled to the first output node of the DAC 1520. Further illustrated is a second load 1540 coupling to the second output node of the DAC 1520.

Additionally, the base station 1500 comprises a receiver 1560 configured to receive a RF receive signal from the antenna element 1570 or another antenna element (not illustrated) of the base station 1500.

For reasons of simplicity, the power supply of the DAC 1520 is not illustrated in FIG. 15.

To this end, a base station using a DAC with increased linearity may be provided. Accordingly, the RF transmit signals may be generated with higher quality compared to conventional approaches.

The base station 1500 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovay a Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 16:
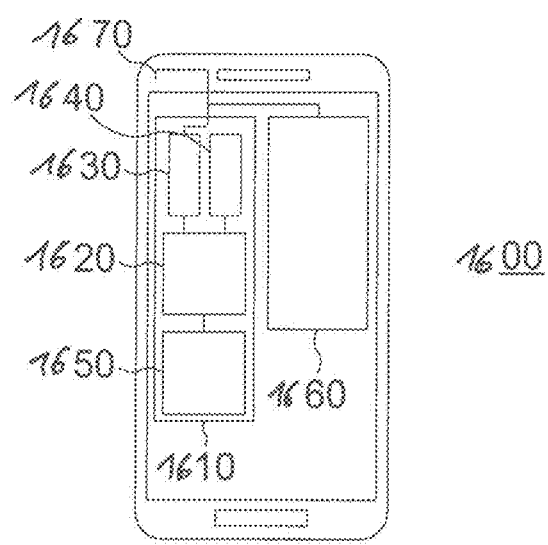
FIG. 16 illustrates an example of a mobile device.

Another example of an implementation using a DAC according to one or more aspects of the architecture described above or one or more examples described above is illustrated in FIG. 16. FIG. 16 schematically illustrates an example of a mobile device 1600 (e.g. mobile phone, smartphone, tablet-computer, or laptop) comprising a DAC 1620 as proposed.

The DAC 1620 is part of a transmitter 1610 (being an example for a data processing system). The transmitter 1620 additionally comprises digital circuitry 1650 (e.g. a DSP) configured to supply the first digital data to the DAC 1620. For example, the digital circuitry 1650 may be configured to generate the first digital data based on data to be wirelessly transmitted.

The mobile device 1600 comprises at least one antenna element 1670 coupled to the transmitter 1610 for radiating one or more RF transmit signals that are based on the DAC output to the environment. For example, the DAC 1620 may be coupled to the antenna element 1670 via one or more intermediate elements 1630 such as a filter, an up-converter (mixer) or a PA. The one or more intermediate elements 1630 and/or the antenna element 1670 may be understood as exemplary loads coupled to the first output node of the DAC 1620. Further illustrated is a second load 1640 coupling to the second output node of the DAC 1620.

Additionally, the mobile device 1600 comprises a receiver 1660 configured to receive a RF receive signal from the antenna element 1670 or another antenna element (not illustrated) of the mobile device 1600.

For reasons of simplicity, the power supply of the DAC 1620 is not illustrated in FIG. 16.

To this end, a mobile device using a DAC with increased linearity may be provided. Accordingly, the RF transmit signals may be generated with higher quality compared to conventional approaches.

The mobile device 1600 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using digital-to-analog conversion according to the proposed architecture or one or more of the examples described above may be configured to operate according to one of the 3GPP-standardized mobile communication networks or systems. The mobile or wireless communication system may correspond to, for example, a 5$^{th}$ Generation New Radio (5G NR), a Long-Term Evolution (LTE), an LTE-Advanced (LTEA), High Speed Packet Access (HSPA), a Universal Mobile Telecommunication System (UMTS) or a UMTS Terrestrial Radio Access Network (UTRAN), an evolved-UTRAN (eU-TRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 17:
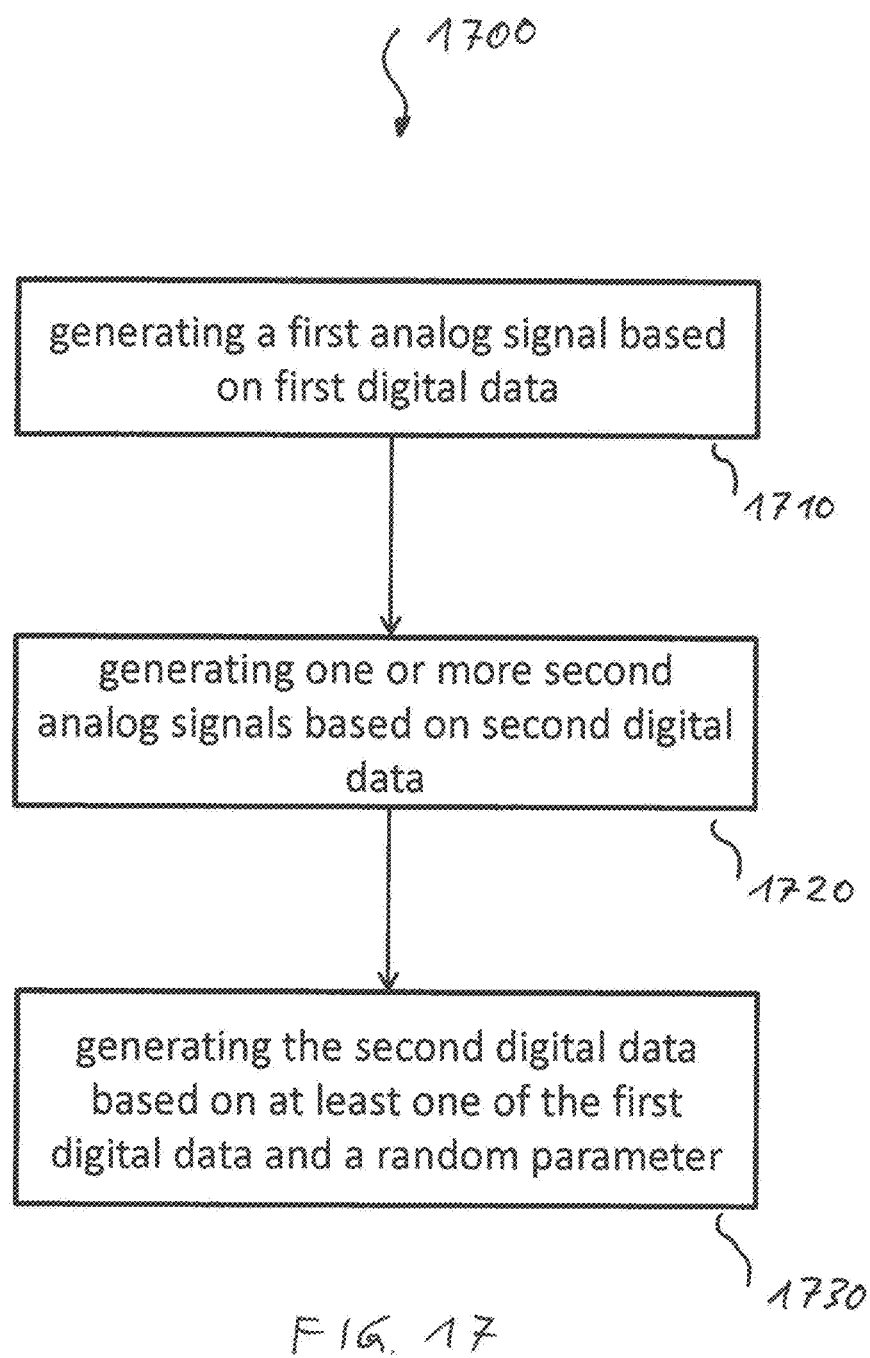
FIG. 17 is a flowchart of a method for generating a first analog signal based on first digital data.

FIG. 17 shows a flowchart of a method for generating a first analog signal based on first digital data according to an example. The method 1700 comprises generating 1710 a first analog signal based on first digital data by a plurality of first digital-to-analog converter cells of a digital-to-analog converter. The first digital-to-analog converter cells of the plurality of first digital-to-analog converter cells are coupled to a first output node for coupling to a first load. Further, the method 1700 comprises generating 1720 one or more second analog signals based on second digital data by a plurality of second digital-to-analog converter cells. The second digital-to-analog converter cells of the plurality of second digital-to-analog converter cells are coupled to one or more second output nodes for coupling to one or more second loads. Additionally, the method 1700 comprises generating 1710 the second digital data based on at least one of the first digital data and a random parameter. The plurality of first digital-to-analog converter cells may comprise more digital-to-analog converter cells than the plurality of second digital-to-analog converter cells. Additionally or alternatively, the second digital-to-analog converter cells of the plurality of second digital-to-analog converter cells may be configured to be individually enabled based on individual enabling signals.

More details and aspects are mentioned in connection with the embodiments described above or below. The method 1700 may comprise one or more optional additional features corresponding to one or more aspects mentioned in connection with the proposed concept of one or more embodiments described above or below (e.g. FIGS. 1-16).

The examples described herein may be summarized as follows:

Example 1 relates to a digital-to-analog converter, comprising:

a plurality of first digital-to-analog converter cells configured to generate a first analog signal based on first digital data, wherein the first digital-to-analog converter cells of the plurality of first digital-to-analog converter cells are coupled to a first output node for coupling to a first load;

a plurality of second digital-to-analog converter cells configured to generate one or more second analog signals based on second digital data, wherein the second digital-to-analog converter cells of the plurality of second digital-to-analog converter cells are coupled to one or more second output nodes, and wherein the plurality of first digital-to-analog converter cells and the plurality of second digital-to-analog converter cells are coupled to a power supply node for coupling to a mutual power supply; and a data generation circuit configured to generate the second digital data based on at least one of the first digital data and a random parameter, wherein at least one of:
the plurality of first digital-to-analog converter cells comprises more digital-to-analog converter cells than the plurality of second digital-to-analog converter cells; or
the second digital-to-analog converter cells of the plurality of second digital-to-analog converter cells are configured to be individually enabled based on individual enabling signals.

Example 2 relates to the digital-to-analog converter of example 1, wherein the second digital-to-analog converter cells are dummy cells not contributing to the first analog signal.

Example 3 relates to the digital-to-analog converter of one of the previous examples, wherein the digital-to-analog converter is configured to generate or receive the individual enabling signals from a signal processing circuit, wherein the individual enabling signals are generated so that a number of enabled second digital-to-analog converter cells varies over time.

Example 4 relates to the digital-to-analog converter of one of the previous examples, wherein digital-to-analog converter is configured to generate or receive the individual enabling signals from a signal processing circuit, wherein the individual enabling signals are generated so that a number of enabled second digital-to-analog converter cells is lower than the total number of first digital-to-analog converter cells.

Example 5 relates to the digital-to-analog converter of one of the previous examples, wherein digital-to-analog converter is configured to generate or receive the individual enabling signals from a signal processing circuit, wherein the individual enabling signals are generated so that the number of enabled second digital-to-analog converter cells is based on at least one of:

a root-mean-square power of the first analog signal;
a ratio between peak power of the first analog signal and a constant; and
a ratio of the peak power of the first analog signal and a multiplication of the peak-to-average power ratio of the first analog signal and a performance scaling factor.

Example 6 relates to the digital-to-analog converter of one of the previous examples, wherein the data generation circuit is configured to generate the second digital data such that the second digital data is the opposite of the first digital data, if the number of activated first digital-to-analog converter cells is lower than at least one of:

the number of second digital-to-analog converter cells; or
the number of enabled second digital-to-analog converter cells.

Example 7 relates to the digital-to-analog converter of one of the previous examples, wherein the data generation circuit is configured to generate the second digital data such that a signal value represented by the second digital data corresponds to a constant value minus an absolute signal value represented by the first digital data, if the number of activated first digital-to-analog converter cells is lower than at least one of:
  the number of second digital-to-analog converter cells; or
  the number of enabled second digital-to-analog converter cells.

Example 8 relates to the digital-to-analog converter of one of the previous examples, wherein the data generation circuit is configured to generate the second digital data such that a temporal progression of a sum of an absolute signal value represented by the second digital data and an absolute signal value represented by the first digital data is constant, if the number of activated first digital-to-analog converter cells is lower than at least one of:
  the number of second digital-to-analog converter cells; or
  the number of enabled second digital-to-analog converter cells.

Example 9 relates to the digital-to-analog converter of one of the previous examples, wherein the data generation circuit is configured to generate the second digital data such that a sum of the current supplied to the plurality of first digital-to-analog converter cells and the current supplied to the plurality of second digital-to-analog converter cells differs by less than 10% from a reference sum current supplied to the first digital-to-analog converter cells and the plurality of second digital-to-analog converter cells throughout at least 50% of the sample periods of the first digital data.

Example 10 relates to the digital-to-analog converter of example 9, wherein the sum of the current supplied to the plurality of first digital-to-analog converter cells and the current supplied to the plurality of second digital-to-analog converter cells differs by more than 10% from the reference sum current, if the number of activated first digital-to-analog converter cells is higher than at least one of:
  the total number of second digital-to-analog converter cells; or
  the number of enabled second digital-to-analog converter cells.

Example 11 relates to the digital-to-analog converter of one of the previous examples, wherein the data generation circuit is configured to generate the second digital data based on the random parameter such that a number of second digital-to-analog converter cells switching between directly succeeding sample periods of the first digital data varies randomly.

Example 12 relates to the digital-to-analog converter of one of the previous examples, wherein the data generation circuit is configured to generate the second digital data such that a sum of first digital-to-analog converter cells and second digital-to-analog converter cells switching between directly succeeding sample periods of the first digital data differs by less than 10% from a reference number of switching cells throughout at least 50% of the sample periods of the first digital data.

Example 13 relates to the digital-to-analog converter of example 12, wherein the sum of first digital-to-analog converter cells and second digital-to-analog converter cells switching between succeeding sample periods of the first digital data differs by more than 10% from the reference number of switching cells, if the number of first digital-to-analog converter cells switching between succeeding sample periods is higher than at least one of:
  the total number of second digital-to-analog converter cells; or
  the number of enabled second digital-to-analog converter cells.

Example 14 relates to the digital-to-analog converter of one of the previous examples, wherein each first digital-to-analog converter cell of the plurality of first digital-to-analog converter cells and each second digital-to-analog converter cell of the plurality of second digital-to-analog converter cells comprises a driver circuit and a cell circuit, wherein the driver circuits of the plurality of first digital-to-analog converter cells and the driver circuits of the plurality of second digital-to-analog converter cells are connected to a first power supply node for coupling to a first mutual power supply, wherein the cell circuits of the plurality of first digital-to-analog converter cells and the cell circuits of the plurality of second digital-to-analog converter cells are connected to a second power supply node for coupling to a second mutual power supply, wherein the first power supply node is electrically insulated from the second power supply node.

Example 15 relates to the digital-to-analog converter of one of the previous examples, wherein the at least one of:
  the plurality of first digital-to-analog converter cells comprises at least twice as many digital-to-analog converter cells than the plurality of second digital-to-analog converter cells; or
  the second digital-to-analog converter cells of the plurality of second digital-to-analog converter cells are configured to be individually enabled based on individual enabling signals so that a number of enabled second digital-to-analog converter cells is at most 50% of a total number of first digital-to-analog converter cells.

Example 16 relates to the digital-to-analog converter of one of the previous examples, wherein the one or more second loads couple the one or more second output nodes to ground.

Example 17 relates to the digital-to-analog converter of one of the previous examples, wherein the plurality of first digital-to-analog converter cells and the plurality of second digital-to-analog converter cells are capacitive digital-to-analog converter cells.

Example 18 relates to a data processing system, comprising:
  a digital-to-analog converter according to one of the previous examples;
  the first load coupled to the first output node; and
  one or more second loads coupled to the one or more second output nodes.

Example 19 relates to the data processing system of example 18, further comprising the mutual power supply coupled to the plurality of first digital-to-analog converter cells and the plurality of second digital-to-analog converter cells.

Example 20 relates to the data processing system of example 18 or 19, wherein the data processing system is a transmitter.

Example 21 relates to the data processing system of example 18, 19 or 20, wherein the transmitter further comprises digital circuitry configured to supply the first digital data to the digital-to-analog converter.

Example 22 relates to the data processing system of example 18, 19, 20 or 21, wherein the digital circuitry is configured to generate the first digital data based on data to be wirelessly transmitted.

Example 23 relates to a base station, comprising:
  a data processing system according to one of the previous examples; and
  at least one antenna element coupled to the digital-to-analog converter.

Example 24 relates to the base station of example 23, further comprising a receiver configured to receive a radio frequency receive signal from the antenna element.

Example 25 relates to a mobile device, comprising:
a data processing system according to one of the previous examples; and
at least one antenna element coupled to the digital-to-analog converter.

Example 26 relates to the mobile device of example 25, further comprising a receiver configured to receive a radio frequency receive signal from the antenna element.

Example 27 relates to a method for generating a first analog signal based on first digital data, the method comprising:
generating a first analog signal based on first digital data by a plurality of first digital-to-analog converter cells of a digital-to-analog converter, wherein the first digital-to-analog converter cells of the plurality of first digital-to-analog converter cells are coupled to a first output node for coupling to a first load;
generating one or more second analog signals based on second digital data by a plurality of second digital-to-analog converter cells, wherein the second digital-to-analog converter cells of the plurality of second digital-to-analog converter cells are coupled to one or more second output nodes for coupling to one or more second loads; and
generating the second digital data based on at least one of the first digital data and a random parameter,
wherein at least one of:
the plurality of first digital-to-analog converter cells comprises more digital-to-analog converter cells than the plurality of second digital-to-analog converter cells; or
the second digital-to-analog converter cells of the plurality of second digital-to-analog converter cells are configured to be individually enabled based on individual enabling signals.

Example 28 is a machine readable storage medium including program code, when executed, to cause a machine to perform the method of example 27.

Example 29 is a machine readable storage including machine readable instructions, when executed, to implement a method or realize an apparatus as implemented by any one of examples 1-27.

Example 30 is a computer program having a program code for performing the method of example 27, when the computer program is executed on a computer or processor.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended.

Furthermore, features of a claim should also be included for any other independent claim, even if that claim is not directly defined as dependent on that other independent claim.

What is claimed is:
1. A digital-to-analog converter, comprising:
a plurality of first digital-to-analog converter cells configured to generate a first analog signal based on first digital data, wherein the first digital-to-analog converter cells of the plurality of first digital-to-analog converter cells are coupled to a first output node for coupling to a first load;
a plurality of second digital-to-analog converter cells configured to generate one or more second analog signals based on second digital data, wherein the second digital-to-analog converter cells of the plurality of second digital-to-analog converter cells are coupled to one or more second output nodes, and wherein the plurality of first digital-to-analog converter cells and the plurality of second digital-to-analog converter cells are coupled to a power supply node for coupling to a mutual power supply; and
a data generation circuit configured to generate the second digital data based on at least one of the first digital data and a random parameter, wherein at least one of:
the plurality of first digital-to-analog converter cells comprises more digital-to-analog converter cells than the plurality of second digital-to-analog converter cells; or
the second digital-to-analog converter cells of the plurality of second digital-to-analog converter cells are configured to be individually enabled based on individual enabling signals.

2. The digital-to-analog converter of claim 1, wherein the second digital-to-analog converter cells are dummy cells not contributing to the first analog signal.

3. The digital-to-analog converter of claim 1, wherein the digital-to-analog converter is configured to generate or receive the individual enabling signals from a signal processing circuit, wherein the individual enabling signals are generated so that a number of enabled second digital-to-analog converter cells varies over time.

4. The digital-to-analog converter of claim 1, wherein digital-to-analog converter is configured to generate or receive the individual enabling signals from a signal processing circuit, wherein the individual enabling signals are generated so that a number of enabled second digital-to-analog converter cells is lower than the total number of first digital-to-analog converter cells.

5. The digital-to-analog converter of claim 1, wherein digital-to-analog converter is configured to generate or receive the individual enabling signals from a signal processing circuit, wherein the individual enabling signals are generated so that the number of enabled second digital-to-analog converter cells is based on at least one of:
a root-mean-square power of the first analog signal;
a ratio between peak power of the first analog signal and a constant; and
a ratio of the peak power of the first analog signal and a multiplication of the peak-to-average power ratio of the first analog signal and a performance scaling factor.

6. The digital-to-analog converter of claim 1, wherein the data generation circuit is configured to generate the second digital data such that the second digital data is the opposite of the first digital data, if the number of activated first digital-to-analog converter cells is lower than at least one of:
the number of second digital-to-analog converter cells; or
the number of enabled second digital-to-analog converter cells.

7. The digital-to-analog converter of claim 1, wherein the data generation circuit is configured to generate the second digital data such that a signal value represented by the second digital data corresponds to a constant value minus an absolute signal value represented by the first digital data, if the number of activated first digital-to-analog converter cells is lower than at least one of:
the number of second digital-to-analog converter cells; or
the number of enabled second digital-to-analog converter cells.

8. The digital-to-analog converter of claim 1, wherein the data generation circuit is configured to generate the second digital data such that a temporal progression of a sum of an absolute signal value represented by the second digital data and an absolute signal value represented by the first digital data is constant, if the number of activated first digital-to-analog converter cells is lower than at least one of:
the number of second digital-to-analog converter cells; or
the number of enabled second digital-to-analog converter cells.

9. The digital-to-analog converter of claim 1, wherein the data generation circuit is configured to generate the second digital data such that a sum of the current supplied to the plurality of first digital-to-analog converter cells and the current supplied to the plurality of second digital-to-analog converter cells differs by less than 10% from a reference sum current supplied to the first digital-to-analog converter cells and the plurality of second digital-to-analog converter cells throughout at least 50% of the sample periods of the first digital data.

10. The digital-to-analog converter of claim 9, wherein the sum of the current supplied to the plurality of first digital-to-analog converter cells and the current supplied to the plurality of second digital-to-analog converter cells differs by more than 10% from the reference sum current, if the number of activated first digital-to-analog converter cells is higher than at least one of:
the total number of second digital-to-analog converter cells; or
the number of enabled second digital-to-analog converter cells.

11. The digital-to-analog converter of claim 1, wherein the data generation circuit is configured to generate the second digital data based on the random parameter such that a number of second digital-to-analog converter cells switching between directly succeeding sample periods of the first digital data varies randomly.

12. The digital-to-analog converter of claim 1, wherein the data generation circuit is configured to generate the second digital data such that a sum of first digital-to-analog converter cells and second digital-to-analog converter cells switching between directly succeeding sample periods of the first digital data differs by less than 10% from a reference number of switching cells throughout at least 50% of the sample periods of the first digital data.

13. The digital-to-analog converter of claim 12, wherein the sum of first digital-to-analog converter cells and second digital-to-analog converter cells switching between succeeding sample periods of the first digital data differs by more than 10% from the reference number of switching cells, if the number of first digital-to-analog converter cells switching between succeeding sample periods is higher than at least one of:
the total number of second digital-to-analog converter cells; or
the number of enabled second digital-to-analog converter cells.

14. The digital-to-analog converter of claim 1, wherein each first digital-to-analog converter cell of the plurality of first digital-to-analog converter cells and each second digital-to-analog converter cell of the plurality of second digital-to-analog converter cells comprises a driver circuit and a cell circuit, wherein the driver circuits of the plurality of first digital-to-analog converter cells and the driver circuits of the plurality of second digital-to-analog converter cells are connected to a first power supply node for coupling to a first mutual power supply, wherein the cell circuits of the plurality of first digital-to-analog converter cells and the cell circuits of the plurality of second digital-to-analog converter cells are connected to a second power supply node for coupling to a second mutual power supply, wherein the first power supply node is electrically insulated from the second power supply node.

15. The digital-to-analog converter of claim 1, wherein the at least one of:
the plurality of first digital-to-analog converter cells comprises at least twice as many digital-to-analog converter cells than the plurality of second digital-to-analog converter cells; or the second digital-to-analog converter cells of the plurality of second digital-to-analog converter cells are configured to be individually enabled based on individual enabling signals so that a number of enabled second digital-to-analog converter cells is at most 50% of a total number of first digital-to-analog converter cells.

16. The digital-to-analog converter of claim 1, wherein the one or more second loads couple the one or more second output nodes to ground.

17. The digital-to-analog converter of claim 1, wherein the plurality of first digital-to-analog converter cells and the plurality of second digital-to-analog converter cells are capacitive digital-to-analog converter cells.

18. A data processing system, comprising:
a digital-to-analog converter according to claim 1;
the first load coupled to the first output node; and
one or more second loads coupled to the one or more second output nodes.

19. The data processing system of claim 18, further comprising the mutual power supply coupled to the plurality of first digital-to-analog converter cells and the plurality of second digital-to-analog converter cells.

20. The data processing system of claim 18, wherein the data processing system is a transmitter.

21. The data processing system of claim 18, wherein the transmitter further comprises digital circuitry configured to supply the first digital data to the digital-to-analog converter.

22. The data processing system of claim 18, wherein the digital circuitry is configured to generate the first digital data based on data to be wirelessly transmitted.

23. A base station, comprising:
a data processing system according to claim 18; and
at least one antenna element coupled to the digital-to-analog converter.

24. A mobile device, comprising:
a data processing system according to claim 18; and
at least one antenna element coupled to the digital-to-analog converter.

\* \* \* \* \*